United States Patent
Rajamani et al.

(10) Patent No.: US 12,490,272 B2
(45) Date of Patent: Dec. 2, 2025

(54) DATA SYNCHRONIZATION TECHNIQUES FOR A HYBRID HARDWARE ACCELERATOR AND PROGRAMMABLE PROCESSING ARRAY ARCHITECTURE

(71) Applicant: Intel Corporation, Santa Clara, CA (US)

(72) Inventors: Kannan Rajamani, Basking Ridge, NJ (US); Kameran Azadet, San Ramon, CA (US); Kevin Kinney, Coopersburg, PA (US); Thomas Smith, Colmar, PA (US); Zoran Zivkovic, Hertogenbosch (NL)

(73) Assignee: Intel Corporation, Santa Clara, CA (US)

(*) Notice: Subject to any disclaimer, the term of this patent is extended or adjusted under 35 U.S.C. 154(b) by 643 days.

(21) Appl. No.: 17/853,194

(22) Filed: Jun. 29, 2022

(65) Prior Publication Data

US 2024/0008045 A1    Jan. 4, 2024

(51) Int. Cl.
*H04W 72/23* (2023.01)
*H04J 3/06* (2006.01)

(52) U.S. Cl.
CPC ........... *H04W 72/23* (2023.01); *H04J 3/0661* (2013.01)

(58) Field of Classification Search
CPC .............................. H04W 72/23; H04J 3/0661
See application file for complete search history.

(56) References Cited

U.S. PATENT DOCUMENTS

2020/0409701 A1* 12/2020 Chen .................. G06F 9/30003

* cited by examiner

*Primary Examiner* — Elton Williams
(74) *Attorney, Agent, or Firm* — Banner & Witcoff, Ltd.

(57) ABSTRACT

Techniques are disclosed for the use of a hybrid architecture that combines a programmable processing array and a hardware accelerator. The hybrid architecture functions to maintain synchronization between data samples to be transmitted and a measured or observed transmission of the data samples. By comparing these blocks of data samples, DFE functions such as digital pre-distortion (DPD) parameter adaptation may be implemented. The hybrid architecture enables high flexibility at low additional cost. To further limit the costs, the programable processing array may have processing power and memory that is reduced compared to conventional processing array implementations.

20 Claims, 14 Drawing Sheets

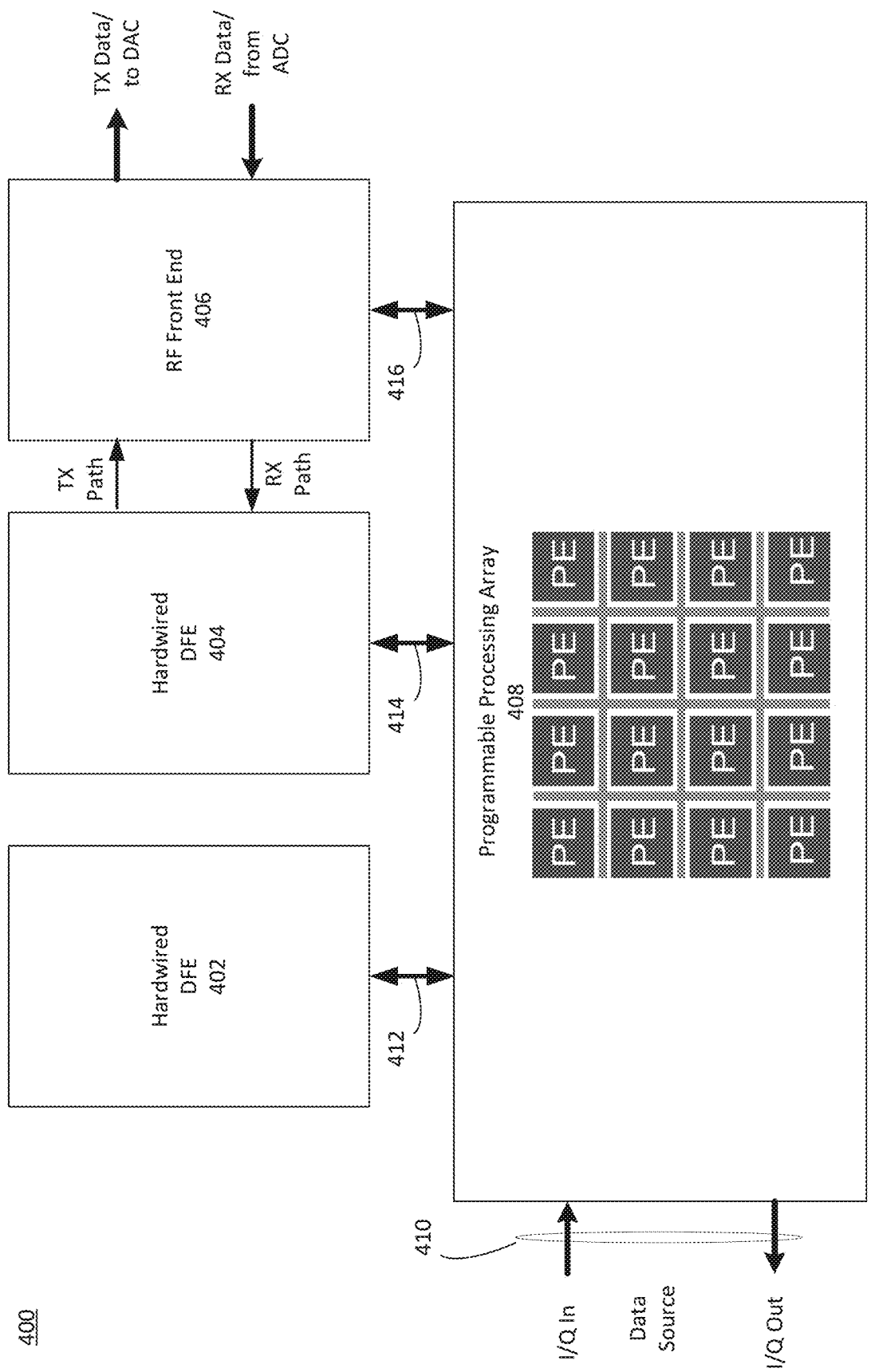

DATA SYNCHRONIZATION TECHNIQUES FOR A HYBRID HARDWARE ACCELERATOR AND PROGRAMMABLE PROCESSING ARRAY ARCHITECTURE

TECHNICAL FIELD

The disclosure described herein generally relates to a hybrid hardware accelerator and programable processing array architecture and, in particular, to techniques for synchronizing data between hardware components within such architectures to facilitate digital pre-distortion (DPD) parameter adaptation.

BACKGROUND

In many applications such as digital front end (DFE) radios, there is a need for fast computations to ensure that the digital data is transmitted and received efficiently. This may include the calculation of digital pre-distortion (DPD) coefficients or other terms used for digital communications, which require fast and accurate processing as data is transmitted and/or received as part of a data stream.

Programmable solutions for DFE radios provide flexibility to adapt the manner in which such computations are performed, but are inefficient in terms of cost and power. For instance, hardwired application specific integrated circuit (ASIC) solutions may be implemented in current DFE radio products, as ASICs are power and cost efficient, but lack the flexibility provided by programmable processing arrays. Programmable processing arrays, on the other hand, are implemented as a programmable array of cores, which are also referred to as processing elements (PEs). Although programmable processing arrays are flexible in their implementation, they are computationally intensive and thus inefficient in terms of power, and are less cost-effective. In other words, although fully soft DFE implementations provide additional flexibility, such solutions are not feasible as a significant amount of processing power is consumed via such computations.

Thus, hybrid systems have been implemented in which a portion of processing is performed in a traditional streaming fashion in dedicated hardware (HW) blocks, while another portion of the processing is performed in the programmable processing array. For instance, a typical DPD pipeline consists of HW blocks configured to perform up-sampling and the application of the DPD terms on data samples to be transmitted, with additional DPD adaptation being performed in software (i.e. via the PEs) or via the dedicated HW blocks. However, such solutions have drawbacks in that a suitable balance is not maintained between both flexibility and efficiency.

BRIEF DESCRIPTION OF THE DRAWINGS/FIGURES

The accompanying drawings, which are incorporated herein and form a part of the specification, illustrate the present disclosure and, together with the description, further serve to explain the principles and to enable a person skilled in the pertinent art to make and use the implementations as discussed herein.

FIG. 4 illustrates a block diagram of a hybrid programmable processing array and hardware accelerator architecture, in accordance with the disclosure;

The present disclosure will be described with reference to the accompanying drawings. The drawing in which an element first appears is typically indicated by the leftmost digit(s) in the corresponding reference number.

DETAILED DESCRIPTION

Figure 1:
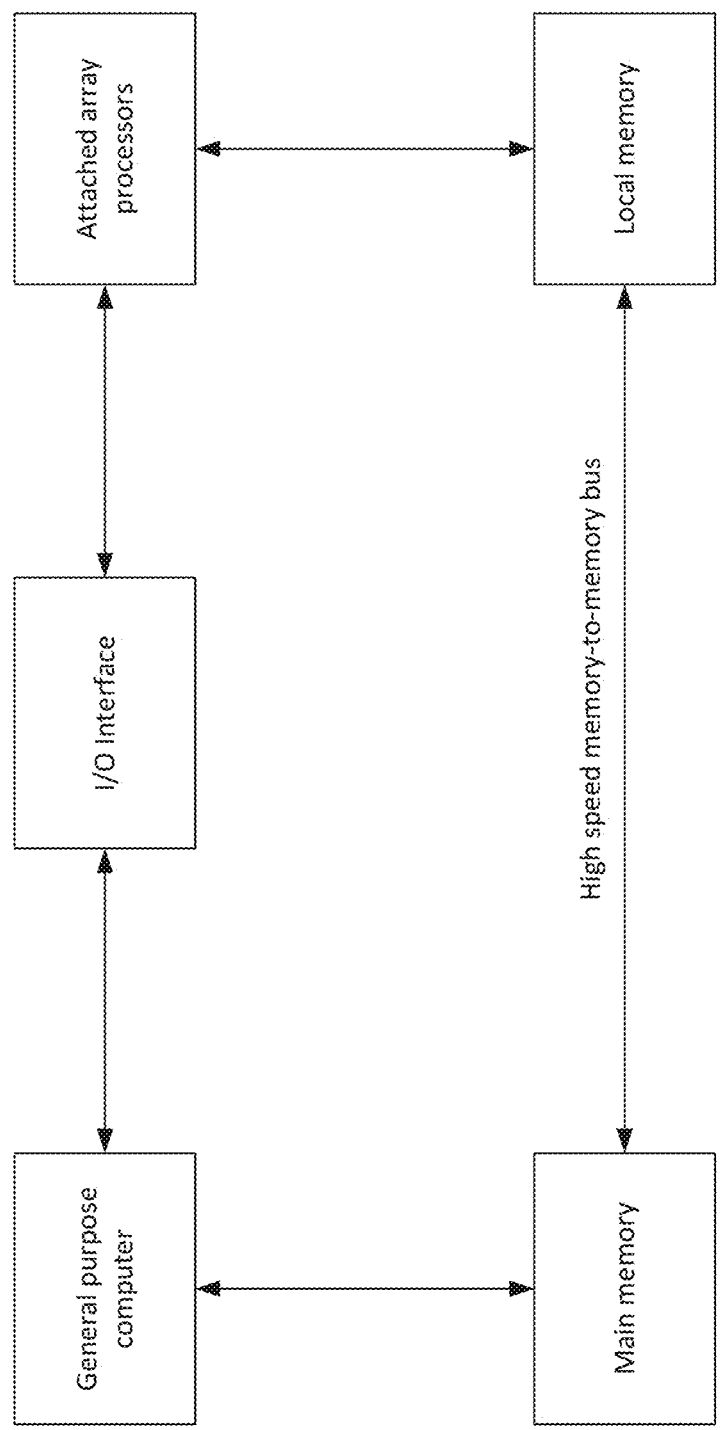
FIG. 1 illustrates an example of a conventional vector processor architecture.

In the following description, numerous specific details are set forth in order to provide a thorough understanding of the present disclosure. However, it will be apparent to those skilled in the art that the implementations of the disclosure, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring the disclosure.

Programmable Processing Array Operation

The programmable processing arrays as discussed in further detail herein may be implemented as vector processors or any other suitable type of array processors, of which vector processors are considered a specialized type. Such array processors may represent a central processing unit (CPU) that implements an instruction set containing instructions that operate on one-dimensional arrays of data referred to as data "vectors." This is in contrast to scalar processors having instructions that operate on single data items. Vector processors can greatly improve performance on certain workloads, notably numerical simulation and similar tasks, by utilizing a number of execution units, which are alternatively referred to herein as cores, execution units processing units, functional units, or processing elements (PEs), and which independently execute specific functions on incoming data streams to achieve a processing flow.

Generally speaking, conventional CPUs manipulate one or two pieces of data at a time. For instance, conventional CPUs may receive an instruction that essentially says "add A to B and put the result in C," with 'C' being an address in memory. Typically, the data is rarely sent in raw form, and is instead "pointed to" via passing an address to a memory location that holds the actual data. Decoding this address and retrieving the data from that particular memory location takes some time, during which a conventional CPU sits idle waiting for the requested data to be retrieved. As CPU speeds have increased, this memory latency has historically become a large impediment to performance.

Thus, to reduce the amount of time consumed by these steps, most modern CPUs use a technique known as instruction pipelining in which the instructions sequentially pass through several sub-units. The first sub-unit reads and decodes the address, the next sub-unit "fetches" the values at those addresses, while the next sub-unit performs the actual mathematical operations. Vector processors take this concept even further. For instance, instead of pipelining just the instructions, vector processors also pipeline the data itself. For example, a vector processor may be fed instructions that indicate not to merely add A to B, but to add all numbers within a specified range of address locations in memory to all of the numbers at another set of address locations in memory. Thus, instead of constantly decoding the instructions and fetching the data needed to complete each one, a vector processor may read a single instruction from memory. This initial instruction is defined in a manner such that the instruction itself indicates that the instruction will be repeatedly executed on another item of data, at an address one increment larger than the last. This allows for significant savings in decoding time.

Figure 2:
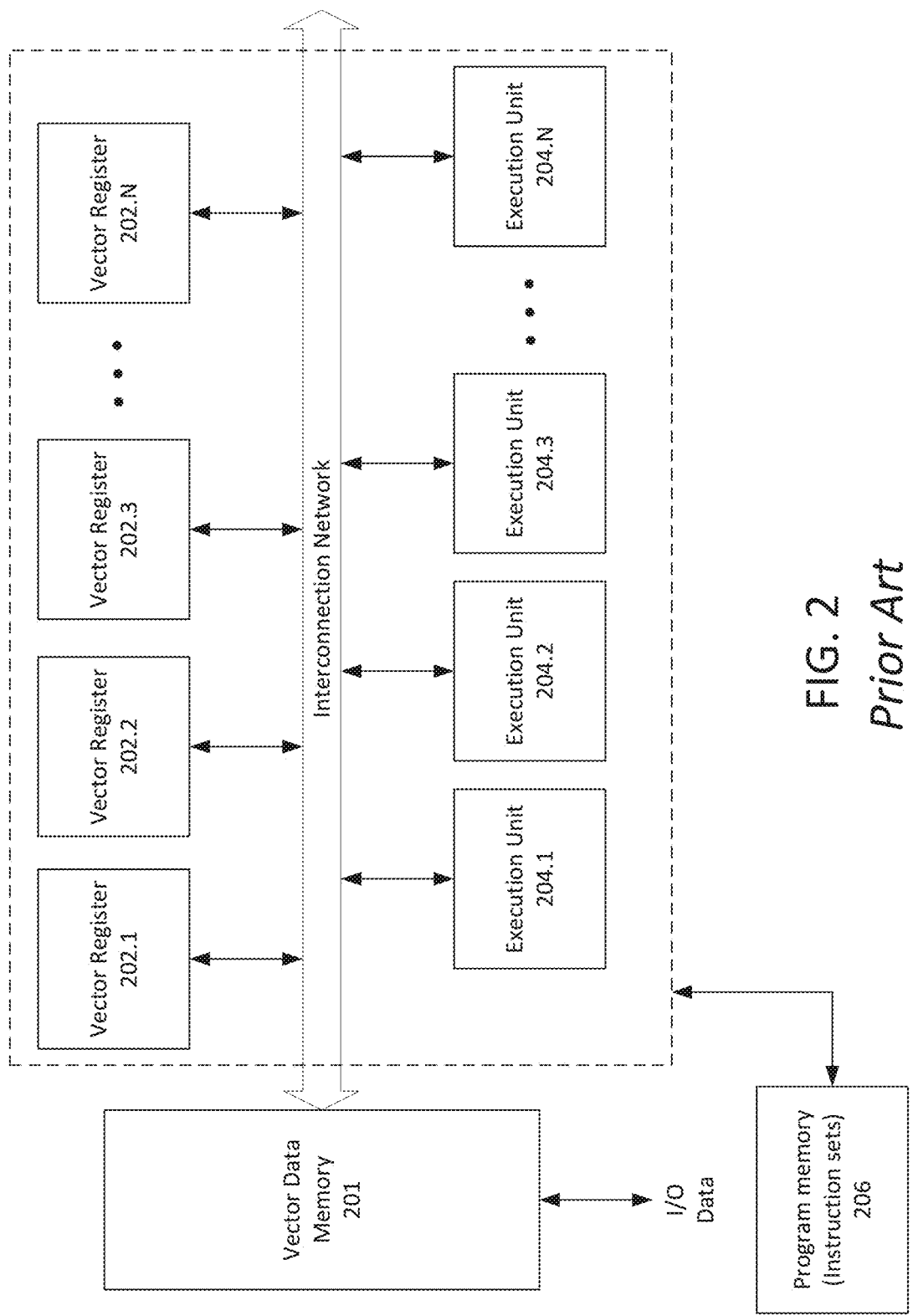
FIG. 2 illustrates another example of a conventional vector processor architecture.

Vector processors may be implemented in accordance with various architectures, and the various programmable array processor architectures as discussed throughout the disclosure as further described herein may be implemented in accordance with any of these architectures or combinations of these architectures, as well as alternative processing array architectures that are different than vector processors. FIGS. 1 and 2 provide two different implementations of a vector processor architecture. FIG. 1 illustrates an attached vector processor, which is attached to a general purpose computer for the purpose of enhancing and improving the performance of that computer in numerical computational tasks. The attached vector processor achieves high performance by means of parallel processing with multiple functional units.

FIG. 2, on the other hand, shows an example of a single instruction stream, multiple data streams (SIMD) vector processor architecture. The vector processor architecture 200 as shown in FIG. 2 may have an architecture consisting of one or more execution units. Each execution unit is capable of executing one instruction. Each instruction can be a control, load/store, scalar, or a vector instruction. Therefore, a processor architecture with N execution units 204.1-204.N as shown in FIG. 2 can issue as many as N instructions every clock cycle. The execution units 204.1-204.N function under the control of a common control unit (such as processing circuitry), thus providing a single instruction stream to control each of the execution units 204.1-204.N. The I/O data as shown in FIG. 2 is typically identified with data communicated between the vector processor 200 and another data source or processor (which may be the common control unit or another processor), depending upon the particular application. The vector data memory 201 thus stores data received as input to be processed by the execution units 204.1-204.N, and data that is output or read from the vector data memory 201 after the data is processed. The vector processor architecture 200 as shown in FIG. 2 is an example of a load-store architecture used by vector processors, which is an instruction set architecture that divides instructions into two categories: memory access (loading and storing data between the vector data memory 201 and the vector registers 202.1-202.N) and the vector processing operations performed by the execution units 204.1-204.N using the data retrieved from and the results stored to the vector registers 202.1-202.N.

Thus, the load-store instruction architecture facilitates data stored in the vector data memory 201 that is to be processed to be loaded into the vector registers 202.1-202.N using load operations, transferred to the execution units 204.1-204.N, processed, written back to the vector registers 202.1-202.N, and then written back to the vector data memory 201 using store operations. The location (address) of the data and the type of processing operation to be performed by each execution unit 204.1-204.N is part of an instruction stored as part of the instruction set in the program memory 206. The movement of data between these various components may be scheduled in accordance with a decoder that accesses the instructions sets from the program memory, which is not shown in further detail in FIG. 2 for purposes of brevity. The interconnection network, which supports the transfer of data amongst the various components of the vector processor architecture 200 as shown in FIG. 2, is generally implemented as a collection of data buses and may be shared among a set of different components, ports, etc. In this way, several execution units 204.1-204.N may write to a single vector register 202, and the data loaded into several vector registers 202.1-202.N may be read by and processed by several of the execution units 204.1-204.N.

The use of instruction sets in accordance with the vector processor architecture 200 is generally known, and therefore an additional description of this operation is not provided for purposes of brevity. Regardless of the particular implementation, vector processors can greatly improve performance on certain workloads but have various drawbacks. For instance, and as noted above, vector processors may form part of what is referred to herein as a programmable processing array, which are traditionally computationally intensive, expensive, and suffer from power inefficiencies. As a result, such programmable vector processors may not be ideal for mobile or base station applications that implement DFE architectures. Furthermore, and as noted above, hardwired ASIC solutions are fast and efficient in terms of power consumption, but lack the flexibility provided by the programmable nature of the vector arrays.

Overview of the Hybrid Architecture and Digital Front End (DFE) Functions

It is noted that current products such as DFEs typically implement either programmable or hardware-based solutions, each resulting in the tradeoffs as noted above. For instance, and as shown in FIG. 3A, DFEs may implement a hardwired ASIC to perform DFE functions such as DPD calculations. As further discussed below, DPD calculations are typically performed by sampling data at specific locations within an RF chain, such as at the output of the power amplifier (PA) that is couple to the antenna. The sampled measurements are then used as feedback to calculate DPD terms that are applied to subsequent data stream transmissions to compensate for various non-idealities such as non-linearities, memory effects, etc., of the RF chain components. Thus, a hardwired ASIC in such implementations represents a customized and optimized hardware solution that performs specific types of calculations, such as DPD calculations, in accordance with the specific set of operating parameters of the DFE. As a result, although such hardware ASIC solutions are fast and efficient in terms of power, these architectures lack flexibility and typically cannot be adapted to other DFEs or applications.

Figure 3B:
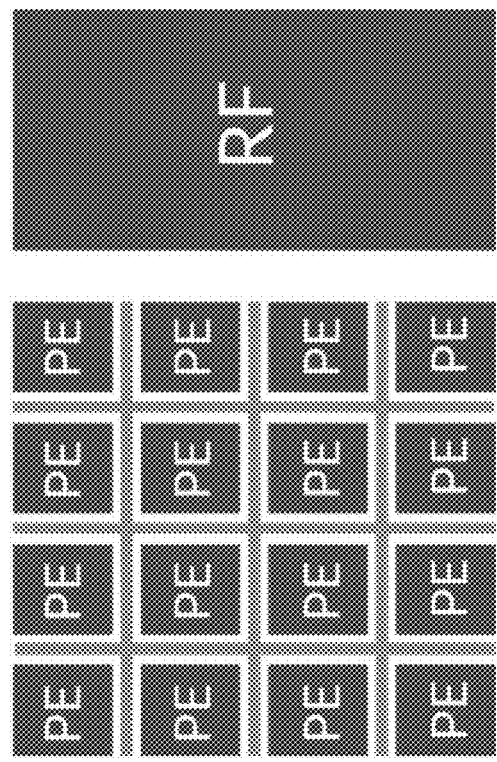
FIG. 3B illustrates a conventional programmable processing array for performing digital front end (DFE) functions.
Figure 3A:
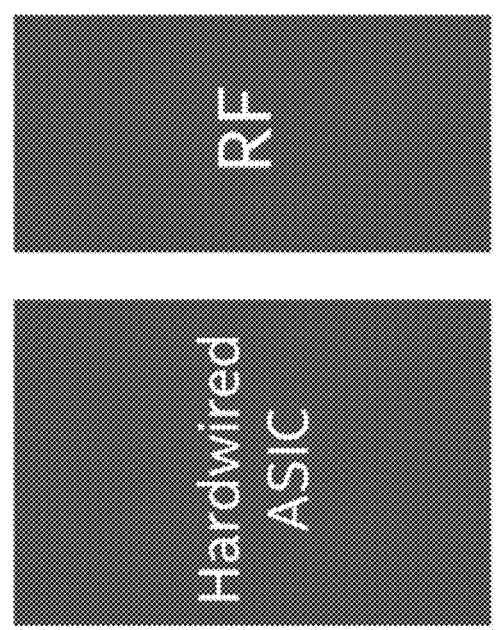
FIG. 3A illustrates a conventional hardwired solution for performing DFE functions.

Thus, other solutions for performing DFE functions include the use of programmable arrays as shown in FIG. 3B. Such solutions are typically field programmable gate arrays (FPGAs) or a mesh of processors with interconnections connecting the programmable processing elements (PEs), which provide some flexibility to adapt how the DFE functions are performed across different products. Thus, such solutions also function to sample data at specific locations within an RF chain, but alternatively implement the use of the PEs to perform the DPD calculations. As a result, such solutions provide flexibility to adapt the manner in which DPD calculations are performed, but do so using increased power and added cost compared to hardwired ASIC solutions.

Figure 3C:
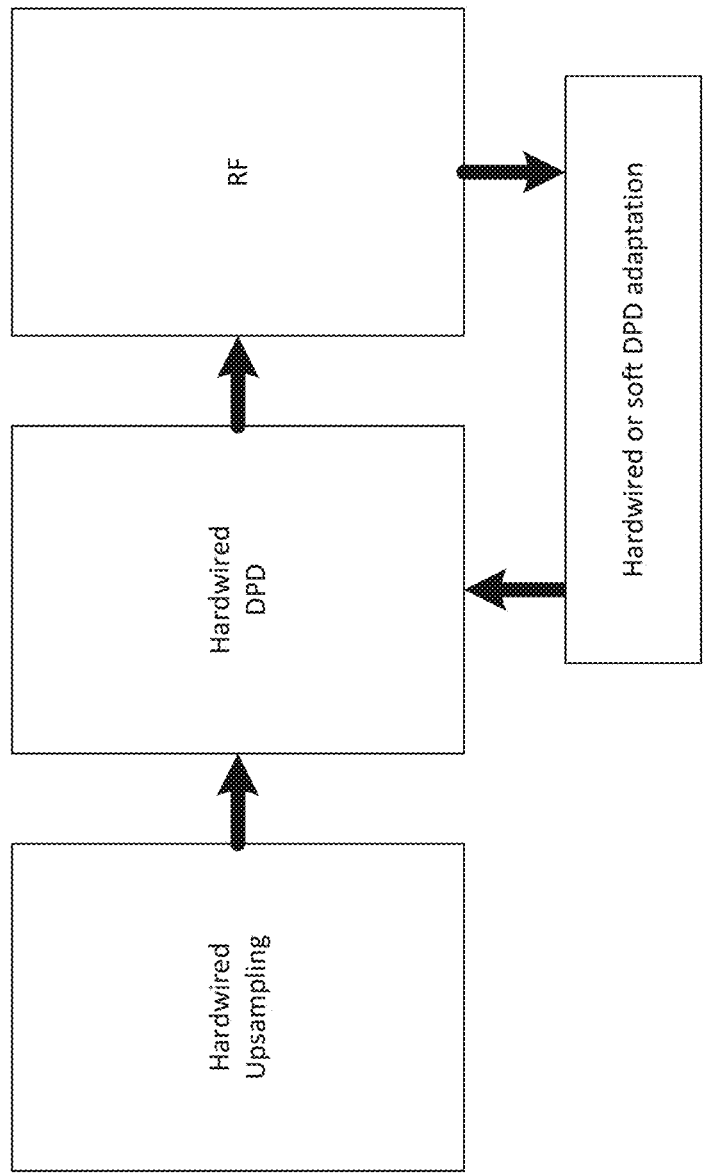
FIG. 3C illustrates a conventional hybrid hardware accelerator and programmable processing array architecture for performing digital front end (DFE) functions.

Furthermore, and as shown in FIG. 3C, hybrid solutions exist that implement a hardwired ASIC configured to perform DFE functions in optimized hardware. This may include the use of a DPD pipeline that consists of HW blocks for up-sampling and applying the DPD terms to data samples to be transmitted. Additional hardwired or software-based components may then be utilized to compute the DPD parameters used for the application of the DPD terms, as well as the adaptation of the DPD parameters over time. However, such products still fail to achieve a solution that optimizes the benefits of both the hardware and software components.

The disclosure as further described herein addresses these issues by implementing a hybrid architecture that combines the benefits of a programmable processing array and a hardwired solution. To do so, and with reference to FIG. 4, the disclosure is directed to a hybrid architecture 400, as well as the interfaces 410, 412, 414, 416 that include interfaces between a data source, a hardwired DFE portion 402 (also referred to herein as a DFE hardware accelerator or simply a hardware accelerator), a hardwired DFE portion 404 (also referred to herein as a DFE hardware accelerator or simply a hardware accelerator), an RF front end 406, and a programable processing array 408. This architecture enables high flexibility at low additional cost. To further limit the costs, the processing array 408 may have processing power and memory that is reduced compared to conventional processing array implementations. The specific interface solutions described herein enable efficient processing on such a cost-effective processing array.

FIG. 4 illustrates a block diagram of a hybrid programmable processing array and hardware accelerator architecture, in accordance with the disclosure. The various components of the hybrid architecture 400 as shown in FIG. 4 may be implemented on a single chip, such as a system on a chip (SoC), or on separate chips or SoCs. The implementation of the hybrid architecture 400 as part of an SoC may be particularly advantageous for applications using high data rates, as doing so obviates the need to couple signals between different chips or via other external devices.

As further discussed herein, the hybrid architecture 400 implements a programmable processing array 408 (again also referred to herein as a processing array) configured to perform processing operations on received arrays of data samples, which may be executed in response to instructions that are transmitted to the individual PEs of the processing array 408. The hybrid architecture 400 is coupled to any suitable data source, which may comprise a data modem, to which the data interface 410 is coupled to facilitate the transmission and reception of digital data streams in accordance with any suitable data rate and/or communication protocol.

The hybrid architecture 400 also implements one or more hardwired DFE portions, which are also referred to herein as hardware accelerators, and which may respectively include hardware blocks dedicated to the execution of specific DFE functions. Thus the hardwired DFE portion 402 and the hardwired DFE portion 404 may constitute respective hardware accelerators identified with the hybrid architecture 400. The hardwired DFE portion 402 and the hardwired DFE portion 404 are coupled to one another via the processing array 408, and the interface 412, 414 between these components and their interaction is discussed in further detail below. Thus, the hybrid architecture 400 functions to implement the PEs of the processing array 408 to receive arrays of data samples, to perform processing operations on the received arrays of data samples in accordance with received instructions, and then generate an array of output data samples after such operations have been performed.

Moreover, the hardware accelerators 402, 404 are configured to implement hardware blocks to receive either the arrays of output data samples provided by the PEs, which are converted to a data format recognized by the hardware accelerators or, alternatively, to receive data from another source such as the DFE TX and/or RX paths. The hardware blocks of the hardware accelerators 402, 404 are thus configured to perform various hardware-based computations on those data samples, and to then generate output data samples after such hardware-based computations have been performed.

The processing operations performed by the PEs of the processing array 408 and the hardware-based computations performed by the hardware blocks of the respective hardware accelerators 402, 406 may, in some scenarios, be various DFE functions. Such DFE functions may include, in various illustrative and non-limiting scenarios, digital signal processing operations that are associated with wireless data communications, the application and/or calculation of finite impulse response (FIR) filter contributions to a digital data stream, equalizer functions, the calculation of digital pre-distortion (DPD) parameters, coefficients, or terms, the application or calculation of Fast Fourier Transforms (FFTs) and/or digital Fourier Transforms (DFTs), matrix operations, mixer and/or frequency correction calculations, peak detection and/or cancellation calculations, signal measurements, average signal measurement calculations over time, digital signal processing of signals transmitted or received via individual antenna data streams for multiple-input-multiple-output (MIMO) antenna systems, the computation and/or application of crest factor reduction (CFR) parameters, etc. Furthermore, the arrays of data samples processed by the PEs of the processing array 408 and the hardware blocks of the respective hardware accelerators 402, 406 as discussed herein may be obtained from an in-phase (I) quadrature-phase (Q) data stream, and may be processed prior to data transmission of wireless signals or after receiving wireless signals.

As discussed in further detail below, the processing array 408 may be implemented as any suitable type of programmable array architecture that includes an array of processing elements (PEs). These processing array 408 may implement any suitable number and/or type of PEs having any level of programmable functionality depending upon the particular application. In some scenarios, the processing array 408 may be implemented as a programmable vector processor having any suitable configuration and design as noted herein. As noted above, a vector processor may include any suitable type of processor that implements an instruction set using instructions designed to operate efficiently and effectively on large one-dimensional arrays of data samples, which may alternatively be referred to as vectors or data vectors. The processing array 408 may, when implemented as a vector processor, implement as the PEs any suitable number of execution units, which may also be referred to as cores, and which may be configured in any suitable manner as further discussed herein. In other scenarios, the processing array 408 may alternatively be implemented with any suitable number of alternate PEs. In accordance with such alternative scenarios, the processing array 408 may include, as the PEs, digital signal processor (DSP) blocks and/or PEs identified with an FPGA, individual DSP processing blocks of a larger DSP, etc.

In any event, the processing array 408 may receive, transmit, and/or perform processing operations on arrays of data samples, which may alternatively be referred to herein as data vectors regardless of the particular implementation of the processing array 408. Each array may thus represent any suitable number of data samples. The processing array 408 thus provides flexibility in the computations performed, as the processing array 408 may access instruction sets or otherwise be programmed to perform processing operations, the specific type being a function of the particular implementation of the processing array 408 and the instructions that are executed at a particular time. That is, scenarios include the PEs of the processing array 408 performing processing operations on the arrays of data samples as discussed herein to provide data bit manipulation, formatting, truncation, mathematical computations, etc.

Depending upon the current instructions provided to the individual PEs of the processing array 408, the PEs may or may not modify the values of the arrays of data samples. In some scenarios, the PEs may receive an array of data samples as input, which are then output and transferred to a respective hardware accelerator such as the hardware accelerator 402 or 404, or another PE, without modifying their values as a result of the execution of the processing operations. This may include the use of processing operations that may reorder, reformat, or reorganize the arrays of data samples. In other scenarios, the processing operations may include modifying an array of data samples received as input, which are then output and provided to a hardware accelerator 402, 404 (or another PE). Thus, each PE of the processing array 408 may perform processing operations on an array of input data samples to provide an array of output data samples. These processing operations may represent any suitable type of task such that the output data samples may represent a modification, bit manipulation, formatting, truncation, mathematical computations, etc. on the array input data samples.

For the hardware accelerator 402, the DFE functions may include digital up-conversion (i.e. up-sampling from baseband to an IF or RF frequency), filtering, and/or band combining of data samples that are to be transmitted. The hardware accelerator 402 may also perform DFE functions such as digital down-sampling (i.e. down-conversion from IF or RF to baseband), filtering, and band separation of data samples that have been received.

Moreover, and with respect to the hardware accelerator 404, the DFE functions may include the application of DPD coefficients or terms to be applied to the up-converted, filtered, and band-combined data samples output by the hardwired up-sampling portion 402. The DPD coefficients or terms may be modified over time to dynamically adapt to operating conditions and to account for various non-idealities of the power amplifier (PA) and/or other components of the transmit chain used for data transmission. Thus, the hardware accelerator 404 may receive the DPD parameters that have been computed by the programmable processing array 408, which are then used to evaluate and/or apply the appropriate DPD function to data samples to be transmitted.

As further discussed below, the programmable processing array 408 computes the adapted DPD parameters by receiving a block (i.e. array) of TX data samples that have been sampled from a stream of the up-converted, filtered, and band-combined digital data samples output by the hardwired up-sampling portion 402. The programmable processing array 408 also receives a block (i.e. array) of "observed" RX data samples that have been sampled from the output of the PA and then demodulated, down-sampled (i.e. down-converted from RF to IF), etc. on the receive chain via the RF front end 406. Thus, and as further discussed below, the block of TX data samples are compared with the block of RX data samples associated with a feedback measurement performed with respect to the transmission of the TX data samples. From these two sets of data samples, the programmable processing array 408 computes the adapted DPD parameters, which are provided to the hardware accelerator 404 and used to apply the DPD coefficients or terms to subsequent data transmissions. The details of how the data is sampled and synchronized between the hardware accelerator 402, the hardware accelerator 404, the RF front end 406, and the programmable processing array 408 is discussed in further detail below with respect to FIGS. 6A-6C.

DPD Computations

As the computation and adaptation of DPD parameters as well as the application of DPD coefficients or terms using such parameters is discussed extensively throughout the remainder of this disclosure, it is prudent to now provide additional detail regarding such computations. The hardware accelerator 404 may comprise dedicated HW blocks configured to apply DPD coefficients or terms by referencing a set of common lookup table (LUT) based memory entries, which may be used in accordance with any suitable number and/or type of DPD algorithm implementations. As further discussed below, the hardware accelerator 404 is configured efficiently by having limited flexibility to select the number and type of terms up to a maximum number, which is 48 terms in the following illustrative scenario. Thus, and as further described below, the hardware accelerator 404 may implement sets of LUTs that store entries identified with the terms of the particular function that is to be evaluated to output the hard-computed terms. These LUT entries may be computed by the programmable processing array 408 as part of the DPD parameter adaptation computations discussed herein. Thus, such LUTs as described herein may have any suitable size and be identified with any suitable type of memory structure. The entries of the LUTs may thus represent evaluated values of a corresponding function, which may be represented in accordance with the terms of a function as denoted in the Equations 1 and 2 below. The entries of the LUTs used in this manner, i.e. the LUT based memory terms, are then multiplied by a set of data samples or any suitable function (such as a polynomial function). This process may then be repeated for any suitable number of delayed signal versions of an input signal, with the results being summed together as indicated in Equation 2 below to apply the computed terms to a particular set of TX data samples to be transmitted.

The DPD function may represent any suitable function that relates measured signal samples in the RF chain to provide DPD coefficients as a function of those measured samples. For typical DFE applications, the DPD function represents a non-linear function of a complex signal represented as x. The DPD function typically depends on the history of the signal that is needed to model the memory effects of the power amplifier identified with the DFE RF chain. To provide further clarity, let $x_{-d}$ denote a complex value at a measured sample d from the past. A common model from literature is a polynomial function written in the form of Eqn. 1 below as follows:

$$\sum_p \sum_{d_1} \sum_{d_2} \cdots \sum_{d_p} \sigma_{d_1,d_2,\ldots,d_p} x_{-d_1} x_{-d_2} \cdots x_{-d_p} \qquad \text{Eqn. 1}$$

where the signal values from different parts of the history defined by d1, ..., $d_p$ are combined together and multiplied by a corresponding parameter $\theta_{d1, \ldots, d_p}$. The delays d1, ..., $d_p$ and the corresponding parameters are typically determined for each power amplifier in the RF chain implementing the DFE via an optimization process. This optimization process may be performed by the programmable processing array 408 such that the hardware accelerator 404 computes the coefficients to be applied to data samples to be transmitted using the supplied DPD parameters. The variable p represents an order of the polynomial function, and determines the number of various delays d1 ... $d_p$ and terms x–d1.

Another common DPD function implementation is to use lookup table (LUT) entries based on the signal magnitude to model the non-linearity, and then model additional non-linearities using polynomial terms. Thus, if there are to be a maximum of K different terms, with K in the illustrative scenario used in Eqn. 2 below and referenced throughout the disclosure being 48, although the disclosure is not limited to this particular number of terms. A choice of terms common in the literature may be expressed in accordance with Eqn. 2 below as follows:

$$\sum_{d_1,d_2,d_3}^{48} LUT_{d_1,d_2,d_3}(|x_{-d_1}|)[x_{-d_2} \text{ or } x_{-d_2}^2][ \qquad \text{Eqn. 2}$$

$$x_{-d_3}^2 \text{ or } |x|_{-d_3}^2 \text{ or } 1][sc \text{ or } 1]$$

where there are 48 different combinations of the delays d1, d2, d3 and corresponding LUTs for additional polynomial multiplier terms.

The above-referenced Equations are provided for clarity and in a non-limiting sense. Indeed, a large variety of approaches exist to model power amplifiers for the calculation of DPD coefficients. However, the most common approach is to sum the various non-linear terms as explained above. Other approaches to model long term effects involve averaging the signal from the past. Such terms may have the same form as above, although the signal x is replaced by a long term running average of the signal. It is noted that the term "term" as used herein may refer to the computed components of any suitable type of function, such as a non-linear function, which has a corresponding coefficient. Thus, the term(s) may represent any parameters of the corresponding function (such as a non-linear function), although typical applications include the term being synonymous with a single multiplicative coefficient, making the final solution easier to compute. Thus, in such a case the DPD terms may be synonymous with the coefficients, with the DPD parameters being computed by the programmable processing array 408 and utilized by the dedicated HW blocks of the hardware accelerator 404 to apply the computed terms to a particular set of TX data samples to be transmitted.

Programmable Processing Array Architecture

Figure 5:
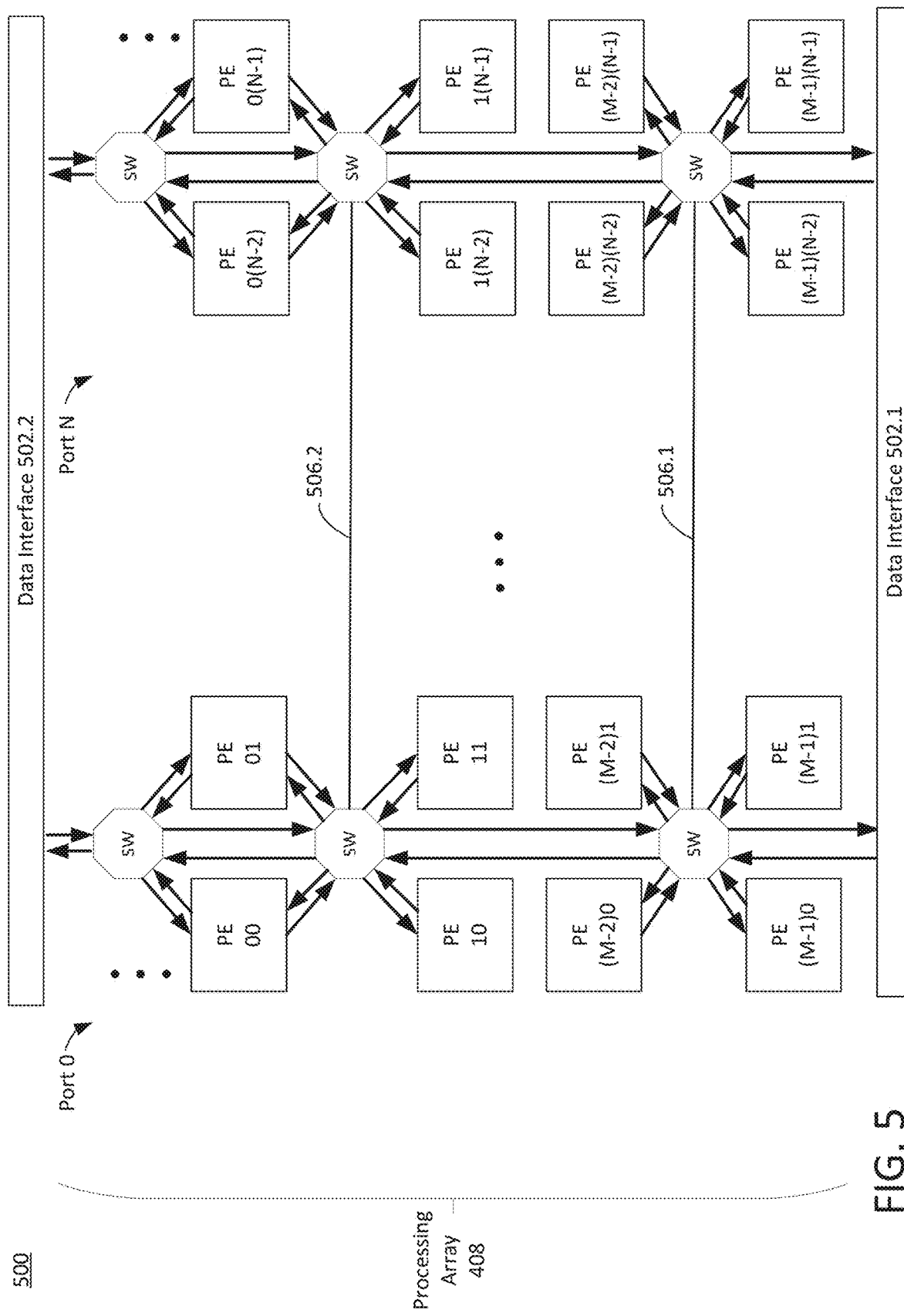
FIG. 5 illustrates a block diagram showing details of a portion of a programmable processing array identified with a hybrid architecture, in accordance with the disclosure.

FIG. 5 illustrates a block diagram showing details of a portion of a programmable processing array identified with a hybrid architecture, in accordance with the disclosure. The programmable processing array portion 500 as shown in FIG. 5 further illustrates details of the programmable processing array 408 as shown in FIG. 4, which again is also referred to herein simply as a processing array. Thus, the processing array 408 may include any suitable number N of ports, with each port including any suitable number M of processing elements (PEs). Although each port is shown in FIG. 5 as including 8 PEs, this is for ease of explanation and brevity, and the processing array 408 may include any suitable number of such PEs per port. Thus, the processing array 408 may include a mesh of PEs, the number of which being equal to the number of PEs per port (M) multiplied by the total number of ports (N). Thus, for an illustrative scenario in which the processing array 408 includes 8 ports and 8 PEs per port, the processing array 408 would implement (M×N)=(8×8)=64 PEs. Moreover, in accordance with such a configuration, each port may be identified with a respective antenna that is used as part of a multiple-input multiple-output (MIMO) communication system. Thus, the number of antennas used in accordance with such systems may be equal to the number N of ports, with each port being dedicated to a data stream transmitted and received per antenna.

Each of the PEs in each port of the processing array 408 may be coupled to the data interfaces 502.1, 502.2, and each PE may perform processing operations on an array of data samples retrieved via the data interfaces 502.1, 502.2 as discussed herein. The access to the array of data samples included in the PEs may be facilitated by any suitable configuration of switches (SW), as denoted in FIG. 5 via the SW blocks. The switches within each of the ports of the processing array may also be coupled to one another via interconnections 506.1, 506.2, with two being shown in FIG. 5 for the illustrative scenario of each port including 8 PEs. Thus, the interconnections 506.1, 506.2, function to arbitrate the operation and corresponding data flow of each grouping of 4 PEs within each port that are respectively coupled to each local port switch. The flow of data to a particular grouping of PEs and a selection of a particular port may be performed in accordance with any suitable techniques, including known techniques. In one illustrative scenario, this may be controlled by referencing the global system clock or other suitable clock via an SoC, network, system, etc., of which the processing array 408 forms a part.

Thus, at any particular time, one or more of the PEs may be provided with and/or access an array of data samples provided on one of the data buses to perform processing operations, with the results then being provided (i.e. transmitted) onto another respective data bus. In other words, any number and combination of the PEs per port may sequentially or concurrently perform processing operations to provide an array of processed (i.e. output) data samples to another PE or to the data interfaces 502.1, 502.2 via any suitable data bus. The decisions regarding which PEs perform the processing operations may be controlled via operation of the switches, which may include the use of control signals in accordance with any suitable techniques to do so, including known techniques.

However, and as further discussed below, the data interfaces 502.1, 502.2 function as "fabric interfaces" to couple the processing array 408 to other components of the hybrid architecture 400. To provide an illustrative scenario which is further described in detail below with reference to FIGS. 6A-6C, the data interfaces 502.1, 502.2 may represent any of the data interfaces 410, 412, 414, and/or 416 as discussed above with reference to FIG. 4. Thus, the data interfaces 502.1, 502.2 are configured to facilitate the exchange of data between the PEs of the processing array 408, the hardware accelerator 402, the hardware accelerator 404, the RF front end 406, and/or the data source. The data interfaces 502.1, 502.2 may thus to be configured to provide data that is to be transmitted to the hybrid architecture 400. The data interfaces 502.1, 502.2 are configured to convert received data samples to arrays of data samples upon which the processing operations are then performed via the PEs of the processing array 408. The data interfaces 502.1, 502.2 are also configured to reverse this process, i.e. to convert the arrays of data samples back to a block or stream of data samples, as the case may be, which are then provided to the hardware accelerator 402, the hardware accelerator 404, the RF front end 406, and/or the data source, etc.

The data interfaces 502.1, 502.2 may represent any suitable number and/or type of data interface that is configured to transfer data samples between any suitable data source and other components of the hybrid architecture 400. Thus, the data interfaces 502.1, 502.2 may be implemented as any suitable type of data interface for this purpose, such as a standardized serial interface used by data converters (ADCs and DACs) and logic devices (FPGAs or ASICs), and which may include a JESD-based standard interface and/or a chip-to-chip (C2C) interface. The data samples provided by the data source as shown in FIG. 4 may be in a data array format or provided as streaming (i.e. serial) data bit streams. In the latter case, the data interfaces 502.1, 502.2 may implement any suitable type and/or number of hardware and/or software components, digital logic, etc., to manage the translation of the streams of data bit samples to an array of data samples recognized and implemented via the processing array 408, and vice-versa (i.e. when data is provided from the processing array 408 to another component of the hybrid architecture 400).

The data interfaces 502.1, 502.2 may thus represent different types of data interfaces depending upon the specific implementation of the processing array 408 within the hybrid architecture 400 and the stage within the hybrid architectures 400 in which the data interfaces are implemented. That is, the data interfaces 502.1, 502.2 may be implemented as different components based upon the source of data samples received by the processing array 408, as well as the destination of processed arrays of data samples transmitted by the processing array 408. In one scenario in which the hybrid architecture 400 is implemented as part of a wireless communication device, each of the PEs in the processing array 408 may be coupled to the data interfaces 502.1, 502.2 via any suitable number and/or type of data interconnections, which may include wired buses, ports, etc. The data interfaces 502.1, 502.2 may thus be implemented as a collection of data buses that couple each port (which may represent an individual channel or grouping of individual PEs in the processing array 404) to a data source via a dedicated data bus. Although not shown in detail in the Figures, in accordance with such scenarios each data bus may be adapted for use in a DFE used for wireless communications, and thus the dedicated buses may include a TX and an RX data bus per port in this non-limiting scenario.

Hybrid Architecture Synchronization

Figure 6A:
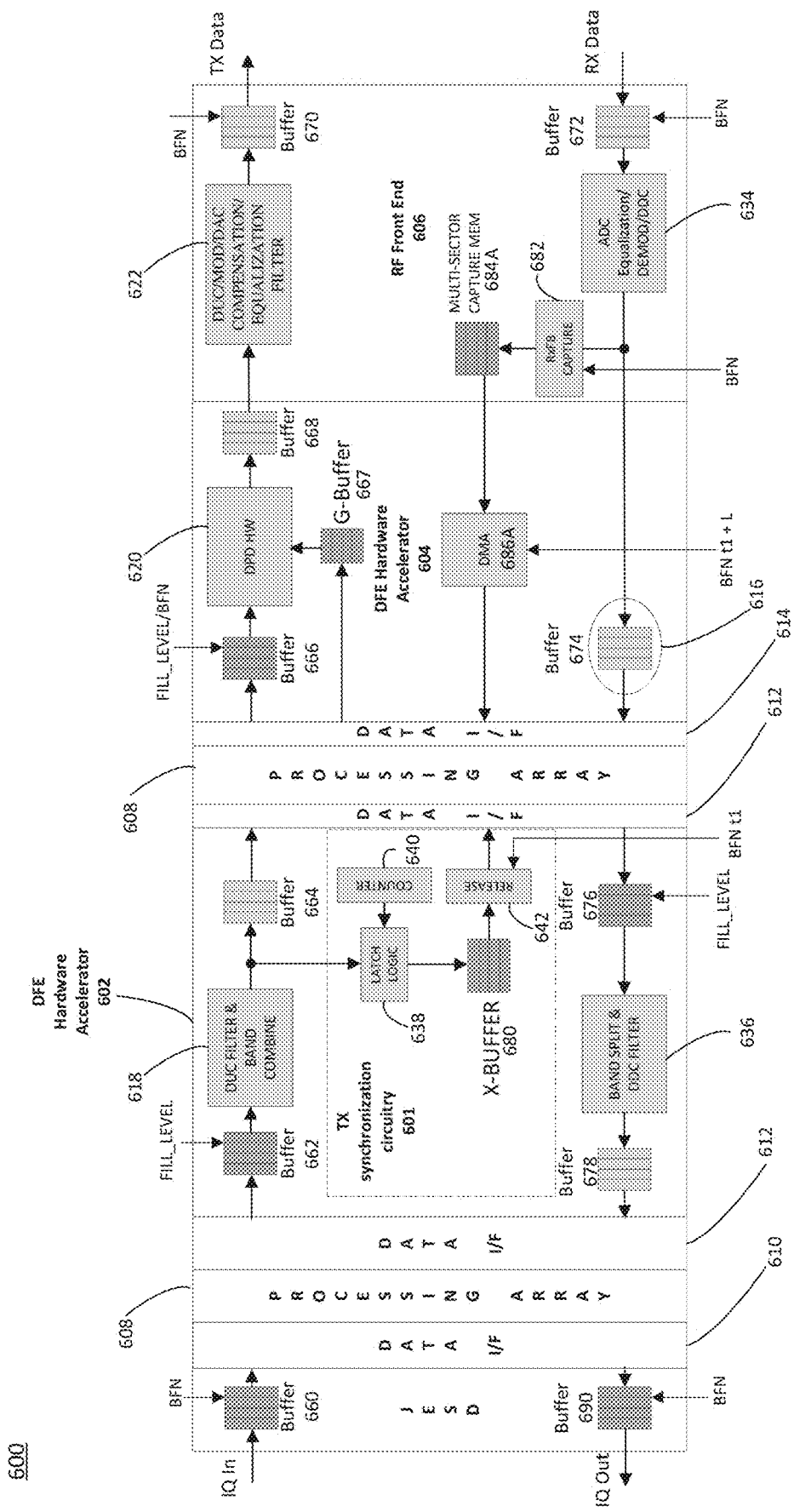
FIG. 6A illustrates a block diagram of a portion of a first hybrid architecture, in accordance with the disclosure.

FIG. 6A illustrates a block diagram of a portion of a first hybrid architecture, in accordance with the disclosure. The hybrid architecture 600 as shown in FIG. 6A may be identified with the hybrid architecture 400 as shown and discussed herein with reference to FIG. 4. Thus, the DFE hardware accelerator 602, the DFE hardware accelerator 604, the RF front end 606, and the processing array 608 as shown in FIG. 6A may be identified with the hardware accelerator 402, the hardware accelerator 404, the RF front end 406, and the processing array 408, respectively, as shown in FIG. 4. Moreover, the data interfaces 610, 612, 614, and 616 as shown in FIG. 6A may be identified with the data interfaces 410, 412, 414, and 416, respectively, as shown in FIG. 4.

The hybrid architecture 600 as shown in FIG. 6 may receive data samples to be transmitted via any suitable data source, which again may be a modem as discussed herein, and which may provide a digital data stream of IQ data samples (IQ In). The data samples are stored in the buffer 660 such that a predetermined number of data samples are stored as a block of data. The buffers as discussed herein, including the buffer 660, may be implemented in accordance with any suitable type of memory and configured to store any suitable number of data samples in accordance with any suitable type of addressable configuration and organization. The buffer 660 may store a block of data samples referenced to a global system counter, which may be implemented as a base station frame number (BFN) counter time in one non-limiting and illustrative scenario. Therefore, although the disclosure uses the BFN counter time in further explanations as provided below, this is a non-limiting scenario and any suitable type of global system counter may be implemented in addition to or instead of the BFN counter time.

Thus, each block of data stored in the buffer 660 may represent a number of data samples with respect to a predetermined number of clock cycles to which a BFN counter is referenced. The BFN counter may regularly generate clocks in accordance with each clock cycle based upon a global synchronization scheme that implemented by the hybrid architecture 600. The BFN counter may indicate, in one illustrative and non-limiting scenario, a radio frame number that is regularly and periodically incremented in accordance with a predetermined time period (such as every 10 milliseconds, every 1 millisecond, etc.) based upon the particular communication protocol that is implemented, and which may be used for network synchronization of a radio base station (RBS) or other suitable wireless communication component in which the hybrid architecture 600 is implemented.

The buffer 660 thus regularly stores blocks of data samples referenced to the BFN counter cycles as streams of data samples are provided. The data interface 610 is configured to transfer the blocks of data samples stored in the buffer 660 to the processing array 608 as new data is received. In other words, as the hybrid architecture 600 functions to perform a series of sequential data transmissions, the buffer 660 stores the data temporarily such that the blocks of data samples are queued up for the next sequential data transmission, which may include one or more blocks of stored data samples, i.e. any suitable range of data samples stored in the buffer 660. In this way, each block of data samples is transferred to the processing array 608 as an array of data samples, i.e. in a format that may be processed by the PEs of the processing array 408 as discussed above. The arrays of data samples may be optionally subjected to one or more processing operations. The processing operations may include any suitable type of operations that may or may not modify the values of the data samples, which may include the DFE functions as discussed herein or other, alternate types of processing operations such as the aforementioned data bit manipulation, formatting, truncation, mathematical computations, filtering, band modulation, digital pre-distortion processing, etc.

Once the processing array 608 has completed the processing operations on each array of data samples transferred in this way, each array of processed data samples is then transferred from the processing array 608 to the DFE hardware accelerator 602 via the data interface 612 and written to another buffer 662. The data interface 612 is thus configured to format the array of processed data samples into a predetermined block of data samples having a size and format that are recognized by the DFE hardware accelerator 602.

The DFE hardware accelerator 602 includes a HW block 618, which is configured to perform a set of predetermined DFE functions on each block of data that is retrieved from the buffer 662. Thus, the HW block 618 may represent any suitable combination of hardware components, processing circuitry such as an ASIC, multipliers, etc. In the present non-limiting and illustrative scenario, the HW block 618 is configured to perform up-sampling, and may optionally perform filtering and band-combining on the block of data samples received from the buffer 662. Thus, the data samples originally written to the buffer 660 may include two or more channels of data identified with sub-bands that are implemented in accordance with any suitable communication protocol. The band-combining operation functions to combine these bands into a single data channel for transmission via a coupled antenna, as discussed herein.

Once the HW block 618 has completed performing the set of predetermined DFE functions on each block of data samples transferred from the buffer 662 in this way, blocks of processed data samples, which again may be up-sampled, filtered, band combined, etc., are written to another buffer 664 and then transferred to the processing array 608 via the data interface 612 as an array of processed data samples. The data interface 612 is thus configured to format the blocks of processed data samples into arrays of data samples having a size and format that are recognized by the PEs of the processing array 608.

The arrays of data samples may once again be optionally subjected to one or more processing operations. The processing operations may include any suitable type of operations that may or may not modify the values of the data samples, such as generating non-linear partial components for pre-distortion and/or power measurements for DPD adaptation decision making. Once the processing array 608 has completed the processing operations on each array of data samples transferred in this way, each array of processed data samples is then transferred from the processing array 608 to the DFE hardware accelerator 604 via the data interface 614 and written to another buffer 666. The data interface 614 is thus configured to format the array of processed data samples into a predetermined block of data samples having a size and format that are recognized by the DFE hardware accelerator 604.

The DFE hardware accelerator 604 includes a HW block 620, which is configured to apply computed DPD terms to a particular set of TX data samples to be transmitted. Again, the DPD terms to be applied may be coefficients or other suitable terms that have been computed or derived from DPD parameters computed by the processing array 608, which are provided to the DPD HW block 620 (such as via the buffer 667 as further discussed below). The DPD terms are applied to each block of data that is retrieved from the buffer 666, which correspond to a number of data samples to be transmitted, thereby generating DPD-weighted TX data samples. Thus, the HW block 620 may represent any suitable combination of hardware components such as LUTs, processing circuitry such as an ASIC, multipliers, etc. The DPD-weighted TX data samples are then written to a buffer 668 and provided to the RF front end block 606. Additional detail regarding how the DPD parameters are calculated via the processing array 608 to adapt the DPD terms over time is provided further below after an explanation of the overall functionality of the hybrid architecture 600.

The RF front end block 606 may include additional HW blocks that represent the final DFE stage with respect to the antennas used to transmit and receive data. Thus, the RF front end block 606 includes a HW block 622, which is configured to perform a set of predetermined DFE functions on each block of DPD-weighted TX data samples retrieved from the buffer 668. Thus, the HW block 622 may represent any suitable combination of hardware components, processing circuitry such as an ASIC, multipliers, etc. In the present non-limiting and illustrative scenario, the HW block 622 may be configured to perform up-sampling from an IF to an RF frequency for data transmission, data modulation in accordance with any suitable communication protocol, and may optionally perform DAC compensation and equalization filtering, which may include the application of a gain factor, on each block of DPD-weighted TX data samples retrieved from the buffer 668. The "final" TX data samples output by the HW block 622 are then written to a buffer 670 and provided to the DAC 624 as shown in FIG. 6C. These data samples are then converted to their analog-value equivalents, provided to the power amplifier 626, and then transmitted via the antenna 628.

Figure 6B:
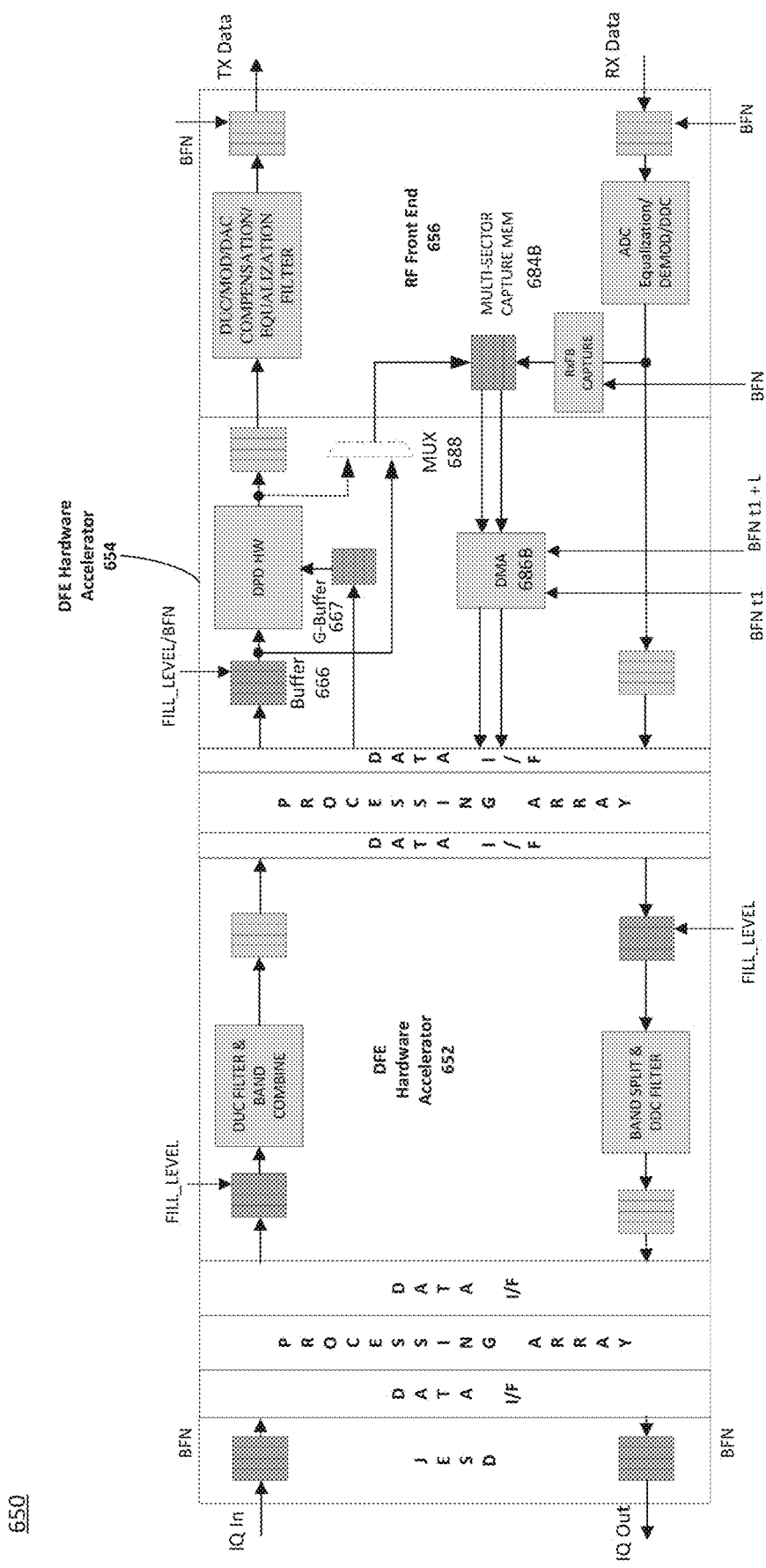
FIG. 6B illustrates a block diagram of a portion of a second hybrid architecture, in accordance with the disclosure.
Figure 6C:
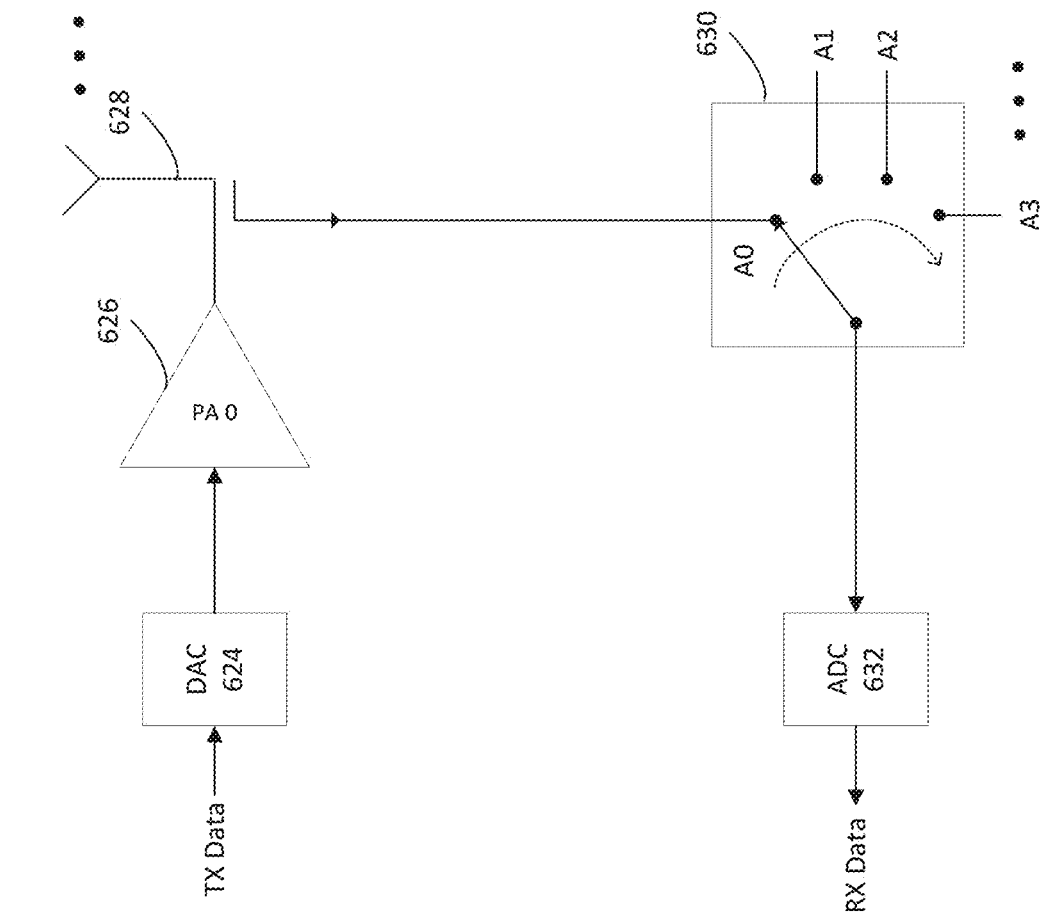
FIG. 6C illustrates a block diagram of a portion of a transmit and a receive path identified with the first and second hybrid architectures as shown in FIGS. 6A and 6B, in accordance with the disclosure.

It is noted that the hybrid architecture 600 as shown in FIGS. 6A-6C may represent a single channel or other suitable portion of an overall hybrid architecture design. Thus, although a single antenna 628 is shown in FIG. 6C, this is for brevity and ease of explanation, and the system in which the hybrid architecture 600 is implemented may include any suitable number of transmit (TX) and receive (RX) antennas. For the non-limiting and illustrative scenario as shown in FIG. 6C, the hybrid architecture 600 is coupled to a system that implements a total of four antennas, with two being dedicated for data transmissions and two being dedicated for data reception. Thus, the switch block 630, which is also included as part of the RF front end 606, is configured to selectively couple a respective one of these four antennas to the receive path of the hybrid architecture 600, the details of which are further discussed below.

Thus, and using the illustrative scenario as shown in FIG. 6C, the switch positions A2 and A3 may represent paths from the two respective dedicated RX antennas (not shown). However, the switch positions A0 and A1 may represent paths to the two respective dedicated TX antennas, with the A0 switch coupling being shown in FIG. 6C to the antenna 628. Thus, the switch positions A0 and A1 represent positions in which received data is obtained via a feedback measurement. In other words, the TX data samples identified with a data transmission, i.e. the data samples stored in the buffer 668 that have been converted to analog values and transmitted via the PA 626, are received as RX data samples after ADC conversion via the ADC 632, and constitute "observed" RX data samples such that the properties of the transmit chain (such as non-idealities) may be identified. This enables a comparison of the original TX data samples from a point earlier in the transmit chain (such as the blocks of processed data samples that have been up-sampled, filtered, band combined, etc. and written to the buffer 664) with the same TX data samples at a point later in the transmit chain (such as the observed RX data samples output via the ADC 632 via the switch path A0 as shown in FIG. 6C). Thus, the term RX data samples may be used herein interchangeably to refer to any data samples received and processed on the receive path that are output via the ADC 632, regardless of whether these data samples are a feedback measurement of a data transmission and/or data samples received via a separate transmission received from another source.

Referring back to FIG. 6A, the RX data samples output by the ADC 632 are stored in a buffer 672. The RF front end 606 also includes a HW block 634, which is configured to perform a set of predetermined DFE functions on each block of RX data samples retrieved from the buffer 672. Thus, the HW block 634 may represent any suitable combination of hardware components, processing circuitry such as an ASIC, multipliers, etc. In the present non-limiting and illustrative scenario, the HW block 634 is configured to perform down-sampling of received RX data samples from an RF to an IF frequency, demodulation in accordance with any suitable communication protocol, and may optionally perform ADC equalization, which may include the application of an RX gain factor, etc., on each block of RX data samples retrieved from the buffer 672. The IF down-sampled RX data samples output by the HW block 634 are then written to a buffer 674 and provided to the processing array 608 as shown in FIG. 6A as arrays of data samples.

The arrays of data samples may once again be optionally subjected to one or more processing operations. The processing operations may include any suitable type of operations that may or may not modify the values of the data samples, such as fine gain correction and Automatic Gain Control (AGC) compensation. Once the processing array 608 has completed the processing operations on each array of data samples transferred in this way, each array of processed data samples is then transferred from the processing array 608 to the DFE hardware accelerator 602 via the data interface 612 and written to another buffer 676. The data interface 612 is thus configured to format the array of processed data samples into a block of data samples having a size and format that are recognized by the DFE hardware accelerator 602.

The DFE hardware accelerator 602 includes a HW block 636, which is configured to perform a set of predetermined DFE functions on each block of data that is retrieved from the buffer 676. Thus, the HW block 636 may represent any suitable combination of hardware components, processing circuitry such as an ASIC, multipliers, etc. In the present non-limiting and illustrative scenario, the HW block 636 is configured to perform down-sampling of the RX data samples from the IF frequency to baseband, and may optionally perform filtering and band-splitting on the block of data samples retrieved from the buffer 676. Thus, the data samples originally written to the buffer 676 may include an aggregation of two or more channels of data identified with sub-bands that are implemented in accordance with any suitable communication protocol. The band-splitting operation functions to separate these data samples into the constituent channels.

Once the HW block 636 has completed the set of predetermined DFE functions on each block of data samples transferred from the buffer 676 in this way, blocks of processed data samples, which again may be down-sampled, filtered, band split, etc., are written to another buffer 678 and then transferred to the processing array 608 via the data interface 612 as an array of processed data samples. The data interface 612 is thus configured to format the blocks of processed data samples into arrays of data samples having a size and format that are recognized by the PEs of the processing array 608. The hybrid architecture 600 as shown in FIG. 6A may receive the RX data samples from the processing array 608 via the data interface 610, which are then stored in the buffer 690 and provided to any suitable data source (such as a data modem) as a digital data stream of IQ data samples (IQ Out).

Thus, the hybrid architecture 600 functions to transmit and receive data samples using a combination of hardware accelerators and a processing array to perform various DFE-based functions. Again, the HW block 620 is configured to apply DPD terms to TX data samples to be transmitted in accordance with the DPD parameters received from the processing array 608 to generate DPD-weighted TX data samples for transmission. A feedback measurement is performed on RX data samples as discussed above to observe the transmission of the DPD-weighted TX data samples output by the PA 626, which are then used by the processing array 608 to dynamically adapt the DPD parameters for subsequent data transmissions.

However, timing considerations are needed to ensure that the correct blocks of data samples are used by the processing array 408 as part of the DPD parameter adaptation process. In other words, if the two sets of data samples that are used to compute the DPD parameters do not correlate in time to the TX data samples and the observed RX data samples corresponding to this same data transmission, then the DPD parameters will not result in a proper compensation of non-idealities in the transmit path. Thus, the disclosure is directed to the use of additional hardware components by each of the DFE hardware accelerators 602, 604 and the RF front end 608 to ensure that a synchronization is maintained between the arrays of data samples received by the processing array 608 for the purpose of computing the adapted DPD parameters over time. The various hardware components as further discussed below are shown with respect to being implemented by respective portions of the hybrid architecture 400, i.e. via each of the DFE hardware accelerators 602, 604 and the RF front end 608 as shown. It is noted that this is a non-limiting and illustrative scenario, and the various components used to perform synchronization within the hardware components of the hybrid architecture 600 may be implemented via any portions thereof.

Figure 7A:
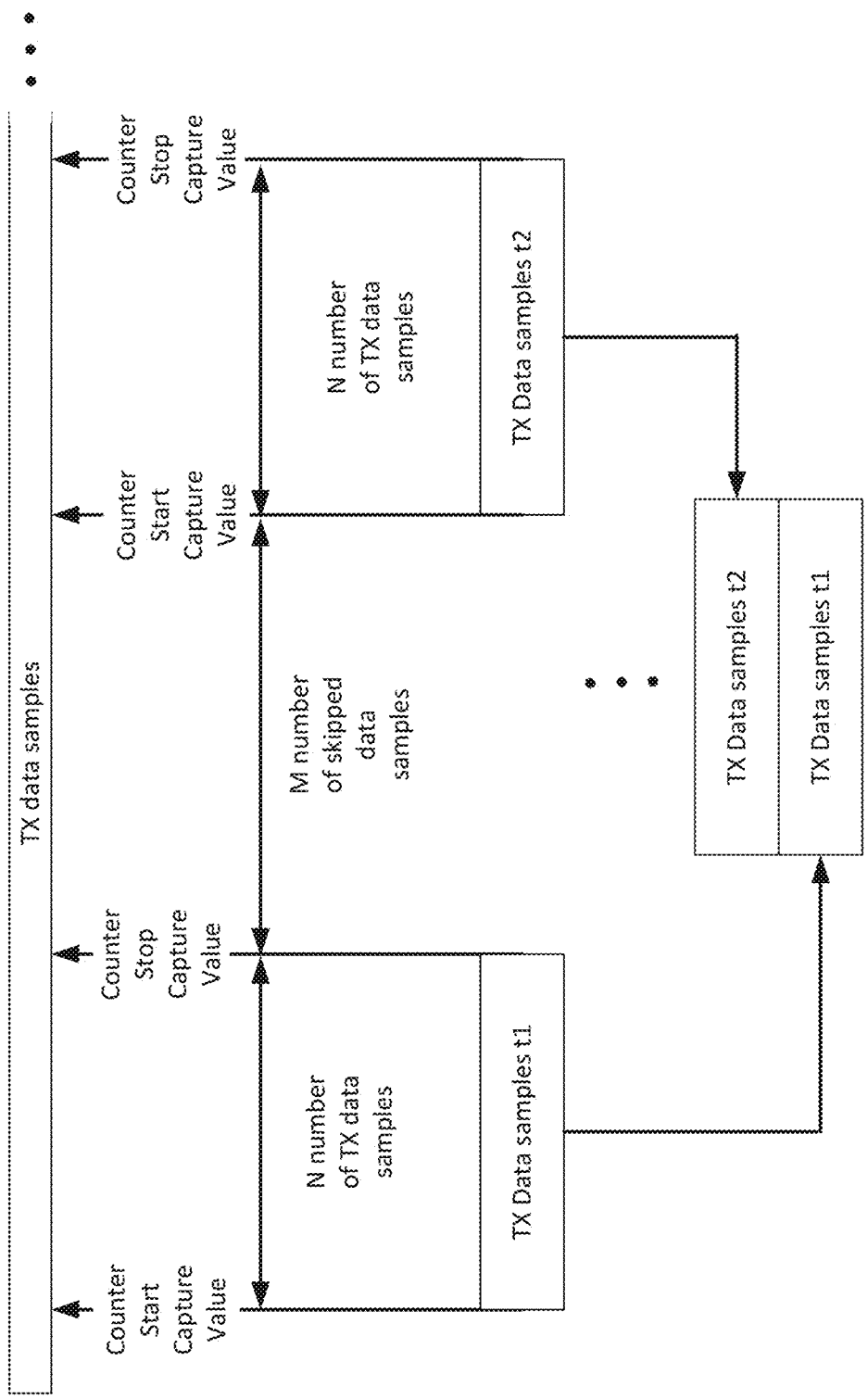
FIG. 7A illustrates a timing diagram with respect to the capturing of TX data samples, in accordance with the disclosure.

With continued reference to FIGS. 6A and 7A, the DFE hardware accelerator 602 includes TX synchronization circuitry 601, which comprises latch logic circuitry 638, a counter 640, release logic circuitry 642, and a buffer 680. The counter 640 may be implemented as any suitable type of counter configured to count in accordance with any suitable clock cycle that is provided as an input. This clock input may be, in some illustrative and non-limiting scenarios, a clock signal provided by the latch logic circuitry 638, which is configured as any suitable combination of hardware components and/or processing circuitry configured to increment the counter 640 as the data samples are sequentially output by the HW block 618.

Thus, the counter 640 may be programmed with a predetermined counter value, which may represent a start capture value that is aligned with (i.e. synchronized with) a BFN counter time that also maintains synchronization with the data transmissions as noted above. Thus, and turning now to FIG. 7A, the counter 640 is configured to be incremented, per data sample, by the latch logic circuitry 638 as the data samples are sequentially output by the HW block 618. Upon the number of these data samples matching the predetermined counter value start capture value, the latch logic circuitry 638 begins latching of the TX data samples sequentially output by the HW block 618. This process continues for a predetermined number of data samples, which is also tracked by the counter 640 via a programmed counter stop capture value.

The programmed counter stop capture value may represent any suitable predetermined value such that the number of samples N that are latched by the latch logic circuitry 638 match a predetermined sample size corresponding to the block of TX data samples as shown in FIG. 7A, which are then stored in the buffer 680 at a time t1. The counter 640 is then further incremented by the latch logic circuitry 638 until a number of skipped samples M are sequentially output by the HW block 618, as shown in FIG. 7A. Additional TX data samples are then latched by the latch logic circuitry 638 and stored in the buffer 680 at a time t2. This process then continues, with the buffer 680 sequentially storing blocks of TX data samples at different times t1, t2, etc., each being referenced to (i.e. aligned and synchronized with) a respective BFN counter time as noted above. Moreover, each block of TX data samples represents a predetermined number of TX samples that have been sampled from those sequentially output by the HW block 618, the predetermined number being a function of the difference between the predetermined counter start and stop capture values, as shown in FIG. 7A. Each respective block of data samples remains in the buffer 680 until being sent to the processing array 608 with a corresponding set of "observed" RX data samples, as noted above. Additional details regarding the synchronization between these two blocks of data is now provided immediately below.

Again, the RF front end 608 receives the observed RX data samples via a feedback measurement as discussed above, which correspond to the transmitted TX data samples at a particular time that is synchronized with the BFN counter. The observed RX data samples are then stored in the buffer 672 and subsequently processed via the HW block 634 in accordance with a set of predetermined DFE functions. The processed observed RX data samples are then stored in the buffer 684A via the HW block 682. Thus, the HW block 682 may be implemented as any suitable type of processing circuitry such as an ASIC, hardware components, software components, or combinations of these, which functions to write the observed RX data samples into the buffer 684A that are synchronized with the BFN counter time. The buffer 684A may function as a multi-sectored capture memory such that when the observed RX data samples are released or read from buffer 684A, there are no collisions due to simultaneous reads from and writes to the buffer 684A. Thus, the multi-sectored capture memory implemented via the buffer 684A represents a memory partitioning in physical memory so that data samples may be accessed independently and concurrently across sectors in memory without resulting in access collisions.

The direct memory access (DMA) block 686A is configured to release the blocks of the observed RX data samples stored in the buffer 684A in a BFN-time controlled manner, which are then written or otherwise provided to the processing array 608, i.e. to the PEs of the processing array 608. In a similar fashion as the DMA block 686A, the release logic circuitry 642 is also configured to release or otherwise provide the stored TX data samples from the buffer 680 to the processing array 608 via the data interface 612 in a BFN-time controlled manner. Thus, the TX data samples stored in the buffer 680 and the corresponding observed RX data samples stored in the buffer 684A are released at BFN-controlled times as needed by the processing array 608 to perform DPD parameter adaptation.

Figure 7B:
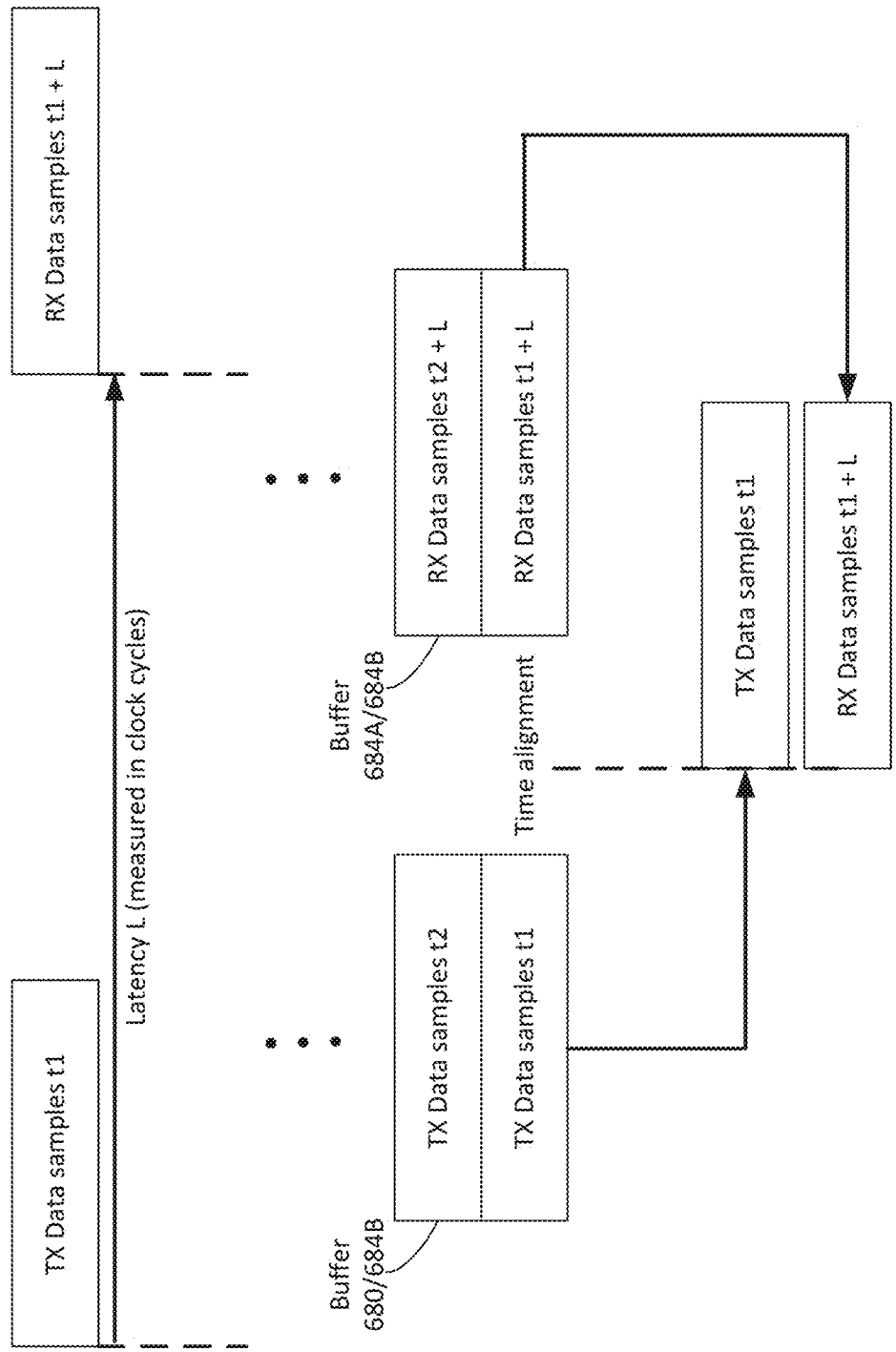
FIG. 7B illustrates a timing diagram with respect to the time alignment of captured TX data samples with observed RX data samples, in accordance with the disclosure.

This is further shown in FIG. 7B, as the release logic circuitry 642 and the DMA block 686A are configured to each release their respective sets of data samples from the buffers 680, 684A in a BFN-time controlled manner such that the blocks of data samples are time-aligned with one another. In other words, the TX data samples corresponding to the time t1 are shown in FIG. 7B, which are released from the buffer 680. The time t1 may represent a global clock-referenced time that enables the stored TX data samples to be referenced to a known time, such as a BFN counter time. The observed RX data samples stored in the buffer 684A are referenced to the time t1+L as shown in FIG. 7B, which are also released from the buffer 684A referenced to a known time. Thus, the observed RX data samples are referenced to the same time as the stored TX data samples, with L representing a latency in clock cycles between when the TX data samples are stored in the buffer 680 and when the TX data samples are transmitted after being subjected to the various DFE functions. The latency L may thus represent a predetermined or otherwise known time, which may be derived from calibration or other suitable testing of the hybrid architecture 600.

In this way, the BFN-timed capture of the TX data samples stored in the buffer 680 are time-aligned with the BFN-timed capture of the observed RX data samples stored in the buffer 684A, accounting for latency through the path from the hardware accelerator 604, to the RF front end 606, and transmitted via the PA 626. This time alignment between the TX data samples stored in the buffer 680 and the observed RX data samples stored in the buffer 684A is achieved due to the precise BFN-timed control of the capture of the TX data samples stored in the buffer 680 and the BFN-timed control of the capture of the observed RX data samples stored in the buffer 684A. Again, the latency L may be known a priori via calibration or other suitable testing procedures. In this way, knowledge of the latency L and the use of the BFN timer as a global clock reference enables the time-alignment of the TX data samples stored in the buffer 680 with the observed RX data samples stored in the buffer 684A. Thus, "time-aligned" in this context means that the observed RX data samples stored in the buffer 684A correspond to the feedback measurement of the data transmission corresponding to the TX data samples stored in the buffer 680. Thus, and as further discussed herein, because the TX data samples stored in the buffer 680 are time-aligned with the observed RX data samples stored in the buffer 684A in this manner, this provides flexibility in how these sets of data samples may be released to the processing array 608 for processing, which may include sequentially (one by one) or concurrently.

Therefore, and turning now to FIG. 7B, the processing array 608 thus receives the observed RX data samples stored in the buffer 684A and the TX data samples stored in the buffer 680 in a time-aligned manner with one another. That is, the observed RX data samples stored in the buffer 684A and the TX data samples stored in the buffer 680 are precisely time-aligned via BFN timed captures/releases and fed to the processing array 608 for DPD parameter adaptation. The processing array 608 is configured to perform the DPD parameter adaptation using these sets of data samples (i.e. the observed RX data samples stored in the buffer 684A and the TX data samples stored in the buffer 680). The processing array 608 may execute the DPD parameter computations in accordance with any suitable techniques, including known techniques, that are implemented using a comparison of transmitted data samples and feedback measurements of the data transmission of those data samples.

In this way, the hybrid architecture 600 enables accurate time alignment of the two data sets using BFN timers and gating the data. Furthermore, the hybrid architecture 600 enables maintaining the data in the buffers and dispatching the data samples to the processing array 608 at the right moment when there is enough memory to process the data. And because the observed RX data samples stored in the buffer 684A and the TX data samples stored in the buffer 680 are already time-aligned with one another when provided to the processing array 608, this eliminates or at least simplifies the computations needed for the processing array 608 to perform time alignment before executing the DPD computations on the sets of data samples. Therefore, this unique timing and buffering scheme enables a very cost effective solution, as the memory requirements of the processing array 608 may be reduced by leveraging the BFN-time control.

Furthermore, the use of the BFN-time control as discussed herein may allow for precise timing control by referencing the BFN counter, and enable the use of time division duplexing (TDD) techniques. To provide an illustrative and non-limiting scenario, one or more of the BFN-timed control capture/release of the TX data samples stored in the buffer 680, the BFN-timed control capture/release of the observed RX data samples stored in the buffer 684A, the DPD computations executed by the processing array 608, and/or the application of the DPD terms using the DPD parameters may be performed during specific time slots. These time slots may correspond, in some scenarios, with a downlink (DL) time slot scheduled in accordance with a communication protocol utilized for the sequential data transmissions.

The BFN timed captures/releases of the observed RX data samples stored in the buffer 684A and the TX data samples stored in the buffer 680 may occur over any suitable number of clock cycles, which may be referenced to the BFN counter time as noted herein. In one illustrative and non-limiting scenario, the observed RX data samples stored in the buffer 684A and the TX data samples stored in the buffer 680 are provided to the processing array 608 in a time-aligned manner over multiple "shots" or clock cycles, with each of the multiple clock cycles being time-referenced to a respective base station frame number (BFN) counter time. Transferring of the data samples over multiple clock cycles in this way may be particularly advantageous so as to further reduce memory requirements in the processing array 608 while maintaining precise time alignment.

Once the processing array 608 has completed the DPD parameter computations, the DPD parameters are stored in the buffer 667 (the G-Buffer) as shown in FIG. 6A. As noted above, the HW block 620 is configured to access the DPD parameters from the buffer 667 in a BFN-time controlled manner. Again, the HW block 620 is configured to apply the computed DPD terms to a particular set of TX data samples to be transmitted using the (now adapted) DPD parameters accessed via the buffer 667. The application of the DPD terms may be performed in a BFN time controlled manner such that the DPD terms are applied to (upconverted) TX data samples identified with the next subsequent data transmission from among the series of sequential data transmissions as noted above. This process may thus be repeated for any suitable number of data transmission to adapt the DPD parameters over time, thereby dynamically compensating for non-idealities in the transmit path.

FIG. 6B illustrates a block diagram of a portion of a second hybrid architecture, in accordance with the disclosure. The hybrid architecture 650 as shown in FIG. 6B operates in a similar manner as the hybrid architecture 600 as shown in FIG. 6A. Moreover, the hybrid architectures 600, 650 implement similar or identical components as one another, and thus only the differences between the two hybrid architectures will be provided in further detail for purposes of brevity. Furthermore, the same reference numbers are used to specify the same components of the hybrid architecture 600, 650 unless otherwise noted.

The hybrid architecture 650 as shown in FIG. 6B comprises a hardware accelerator 652, which operates in a similar manner as the hardware accelerator 602 as shown in FIG. 6A. However, the hardware accelerator 652 does not include the TX synchronization circuitry 601 as shown in FIG. 6A. Thus, the hardware accelerator 652 stores the blocks of TX data samples for transmission in the buffer 664 in the same manner as the hybrid accelerator 602, which may be up-sampled, filtered, band combined, etc. The TX data samples are also provided to the hardware accelerator 654 via the data interfaces 612, 614 after optional processing operations are performed via the processing array 608. The processed arrays of data samples output by the processing array 608 are then stored in the buffer 666. The HW block 620 applies the computed DPD terms to a particular set of TX data samples to be transmitted, which are retrieved form the buffer 666.

However, the hardware accelerator 654 is configured to sample each set of TX data samples either prior to or after the application of the DPD terms by the HW block 620, which are then stored in the buffer 684B as shown in FIG. 6B in each case. The hardware accelerator 654 may optionally comprise a multiplexer (mux) 688 for this purpose. However, the mux 688 is optional, and implementations may include the buffer 684B storing the set of TX data samples either prior to or after the application of the DPD terms by the HW block 620, with the former option being shown in FIG. 6B by way of the solid lines showing the flow of data immediately after the buffer 666. The mux 688 may comprise any suitable configuration of components to facilitate the selection and/or routing of the TX data samples in this manner, and may include a select control line (not shown). Such a select control line may be controlled by way of any suitable electronic control signals via one or more processors, processing circuitry, etc. of the SoC, network, system, etc., of which the hybrid architecture 650 forms a part. In this way, the hardware accelerator 654 may advantageously be configured to dynamically store TX data samples in the buffer 684B that represent TX data samples prior to or after the application of the DPD parameters via the HW block 620, depending upon the particular application.

In any event, the TX data samples may be stored in the buffer 684B in a BFN-time controlled manner, with a predetermined number of the TX data samples being stored in the buffer 684B and being subsequently provided to the processing array 608 via the DMA 686B referenced to a BFN counter time, which are used to compute the DPD parameters that are stored in the buffer 667. Thus, and with reference to FIG. 7B, the set of TX data samples referenced to the time t1 in this scenario is with respect to the TX data samples that have already been processed via the processing array 608 (i.e. stored in the buffer 666 or, alternatively, output by the DPD HW block 620 to be stored in the buffer 668), in contrast to the scenario with respect to the hybrid architecture 600 in which the TX data samples are stored in the buffer 680 prior to processing via the processing array 608. Again, the processing array 608 may perform processing operations to ensure that the blocks of data samples stored in the buffer 666, which are in turn stored in the buffer 684B, are of a predetermined size and referenced to a particular BFN counter time t1. Thus, the counter system utilized by the hardware accelerator 602 via the TX synchronization circuitry 601 as shown in FIG. 6A is not needed in such a case. The hybrid architecture 650 may therefore eliminate the need for the TX synchronization circuitry 601 by performing additional processing operations on the TX data samples via the processing array 608. Thus, a tradeoff between these design constraints may be used to determine which architecture is preferable for a particular application.

Moreover, the observed RX data samples corresponding to the time t1+L as discussed above with respect to transmitted TX data samples are also stored in the buffer 684B. The RX data samples may be received via a feedback measurement in the same manner as discussed above for the hybrid architecture 600. However, the latency time value L is less for the hybrid architecture 650 due to the later sampling point of the TX samples at the time t1 within the transmit path. Nonetheless, the latency L time value still represents a predetermined or known time, which again may be derived from calibration or other suitable testing of the hybrid architecture 650. Thus, the buffer 684B may include addressable storage that is partitioned or organized in any suitable manner to store both the TX data samples and the observed RX data samples as shown in FIG. 7B. The DMA block 686B is configured to release each set of TX data samples in a BFN time controller manner, i.e. to release each set of data samples in a time aligned manner using the respective referenced BFN counter times t1 and t1+L.

The processing array 608 thus receives the TX data samples and the observed RX data samples stored in the buffer 684B time-aligned with one another. The processing array 608 may then compute the updated DPD parameters as discussed above with respect to the hybrid architecture 600, which are then stored in the buffer 667 and provided to the HW block 620. As noted above with respect to FIG. 6A, the HW block 620 applies the computed DPD terms to a particular set of TX data samples to be transmitted, which are retrieved from the buffer 666. In this way, the hybrid architecture 650 as shown in FIG. 6B may dynamically update the DPD parameters and apply the updated DPD terms to subsequent data transmissions.

Figure 8:
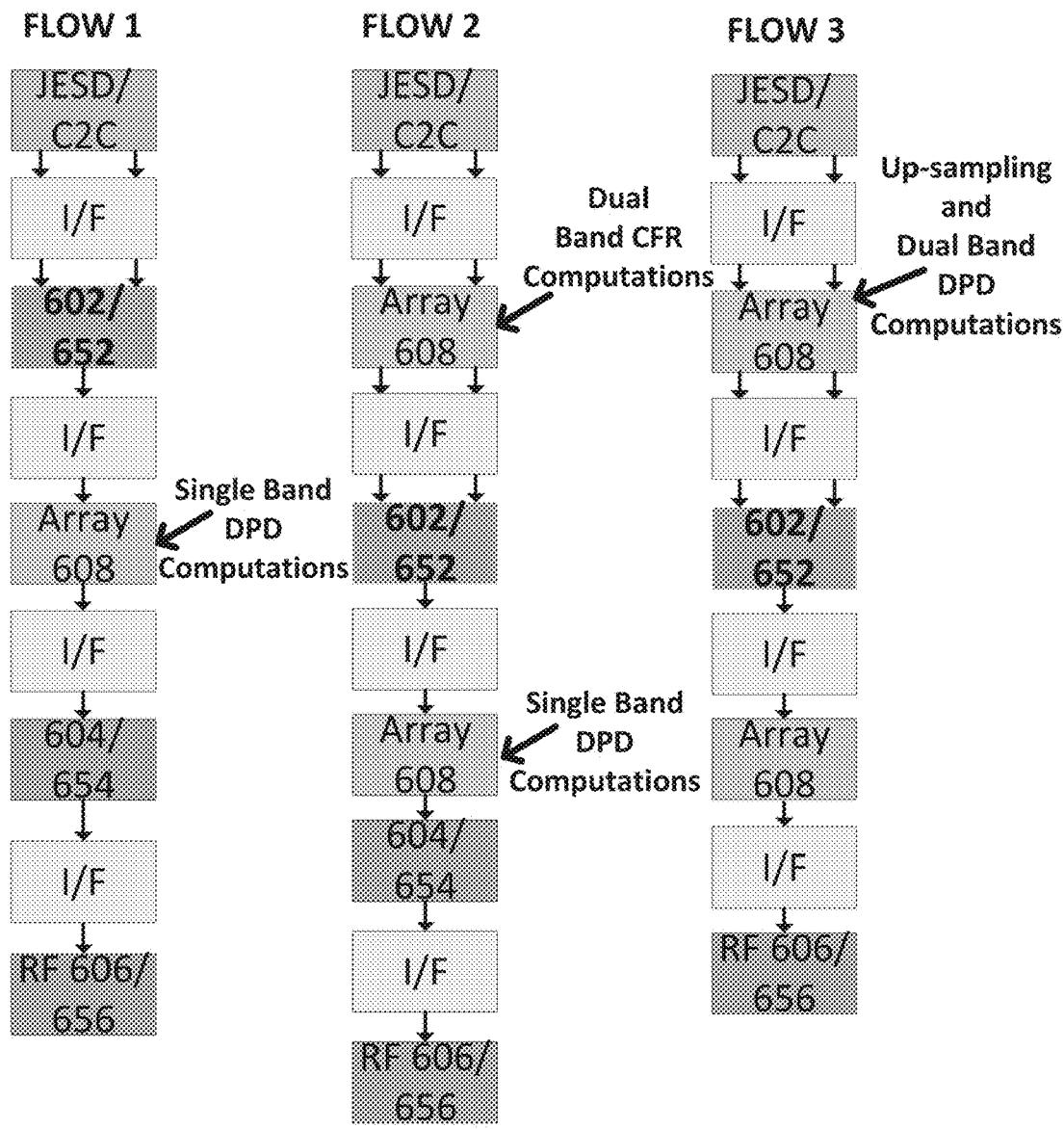
FIG. 8 illustrates a block diagram of different processing flows implemented as part of various hybrid architectures, in accordance with the disclosure.

FIG. 8 illustrates a block diagram of different processing flows implemented as part of various hybrid architectures, in accordance with the disclosure. The different flows as shown in FIG. 8 illustrate the flexibility in the design of the hybrid architectures 600, 650 due to the implementation of the processing array 608 and the hardware accelerators 602, 652, 604, 654. That is, the configuration of the hybrid architecture 600, 650 as discussed above with reference to FIGS. 6A and 6B are provided as a non-limiting illustrative scenario, and alternate configurations of the hybrid architecture 600, 650 may be realized based upon the particular application. Non-limiting illustrative scenarios for such alternate configurations are shown in FIG. 8 and further discussed immediately below.

Each of the three flows as shown in FIG. 8 are provided with respect to the direction of data transmissions, although each flow may also be identified with data reception as discussed above with reference to FIGS. 6A and 6B. Moreover, each of the three flows begins with a data stream provided from any suitable data source, such as a data modem as discussed herein, which is represented in each of the three data flows as "JESD/C2C." Furthermore, each of the three flows ends in the transmission of data via the RF front end 606/656, as noted above with respect to the hybrid architecture 600, 650. Each of the flows also illustrates an interface (I/F), which may correspond to any of the interfaces 610, 612, 614, 616 as discussed herein. These interfaces may collectively be referred to herein as fabric interfaces, as the data interfaces facilitate writing data to and reading data from other stages in the hybrid architecture 600, 650, which may constitute the "fabric" of the hardware accelerator 602, 652, the PEs of the processing array 608, the hardware accelerator 604, 654, the RF front end 606, 656, etc.

Flow 2 corresponds to the flow of data transmissions for the hybrid architectures 600, 650 as shown in FIGS. 6A and 6B. That is, the data samples are provided from the data source to the processing array 608, which may perform one or more processing operations as noted herein, with the processed data samples then being provided to the hardware accelerator 602, 652, as the case may be. In the flow 2 as shown in FIG. 8, the processing operations performed via the processing array 608 include dual band crest factor reduction (CFR) computations. The CFR data identified with the parameters for the use of CFR may be computed via the processing array 608 in accordance with any suitable techniques and/or received via the C2C/JESD data source.

In any event, the hardware accelerator 602, 652 performs one or more DFE functions on the processed data samples provided by the processing array 608 such as up-sampling, band-combining, filtering, etc., with the further processed data samples again being transferred to the processing array 608. The processing array 608 may perform one or more further processing operations as noted herein, with the processed data samples then being provided to the hardware accelerator 604, 654, as the case may be. In the flow 2 as shown in FIG. 8, the processing operations performed via the processing array 608 may include the single band DPD parameter computation, i.e. the DPD parameter computation with respect to the band-combined data samples provided by the hardware accelerator 602, 652. The hardware accelerator 604, 654 may then apply DPD terms to the data samples received from the processing array 608 using the computed single band DPD parameters, as noted herein, which are then transmitted via the RF front end 606, 656, as the case may be.

The flow 1, on the other hand, utilizes the processing array 608 once instead of twice. That is, the hardware accelerator 602, 652 may receive the data samples from the data source and perform one or more DFE functions such as filtering, band combining, and up-sampling to generate a single band of processed data samples, which are then provided to the processing array 608. In the flow 1 as shown in FIG. 8, the processing operations performed via the processing array 608 may include the single band DPD parameter computation, i.e. the DPD parameter computation with respect to the band-combined data samples provided by the hardware accelerator 602, 652. The hardware accelerator 604, 654 may then apply DPD terms to the data samples from the processing array 608 using the computed DPD parameters, as noted herein, which are then transmitted via the RF front end 606, 656, as the case may be. Thus, the flow 1 may be particularly useful for applications in which the hardware accelerator 602, 652 may receive the data samples directly from the data source without processing operations first being performed on those data samples via the processing array 608.

Finally, the flow 3 as shown in FIG. 8 eliminates the hardware accelerator 604, 654, with the functions as discussed herein with respect to the hardware accelerators 604, 654 alternatively being performed via the processing array 608. Thus, this illustrative scenario is similar to flow 2, in which the data samples are provided from the data source to the processing array 608, which may perform one or more processing operations as noted herein, with the processed data samples then being provided to the hardware accelerator 602, 652, as the case may be. However, in the flow 3 the processing array 608 may also perform other DFE functions that were performed by the hardware accelerator 602, 652 as discussed above for the flow 2 such as up-sampling in addition to the dual band DPD parameter computations. The hardware accelerator 602, 652 may then receive the dual bands of data samples and perform additional DFE functions such as filtering, which are then provided to the processing array 608. The processing array 608 then performs several DFE functions that are otherwise executed via the hardware accelerator 604, 654, thus simplifying the design of the hybrid architecture 600, 650. That is, for the flow 3 as shown in FIG. 8, the processing array 608 may apply the DPD terms in accordance with the DPD parameter computations, as discussed above with respect to FIGS. 6A and 6B.

It is noted that the flows as shown in FIG. 8 are provided as illustrative and non-limiting implementations. Any of the processing operations and/or DFE functions as discussed herein may be executed by any combination of the hardware accelerators 602, 652, 604, 654, and/or the processing array 608. This may include single-band or dual-band operations such as CFR computations, DPD parameter computations, DPD applications, etc., based upon the particular configuration of the hybrid architecture 600, 650. In this way, the use of the fabric interfaces as discussed herein provide flexibility to perform band aggregation irrespective of the data source.

Furthermore, the hybrid architecture 600, 650 may be modified by assigning various DFE functions among the processing array 608, the hardware accelerator 602, 652, and the hardware accelerator 652, 654. Therefore, the hybrid architecture 600, 650 advantageously allows for flexibility in design to perform DPD adaptation, as well as other DFE functions such as CFR, filtering, band combing, etc., based upon the particular application. This allows the hardware accelerator functionality to be optionally offloaded to the processing array 608 when it is desirable to increase the processing power and memory of the processing array 608 or, in contrast, to reduce the memory and processing power of the processing array 608 in favor of the increased use of the hardware accelerators 602, 652, 604, 654.

Figure 9:
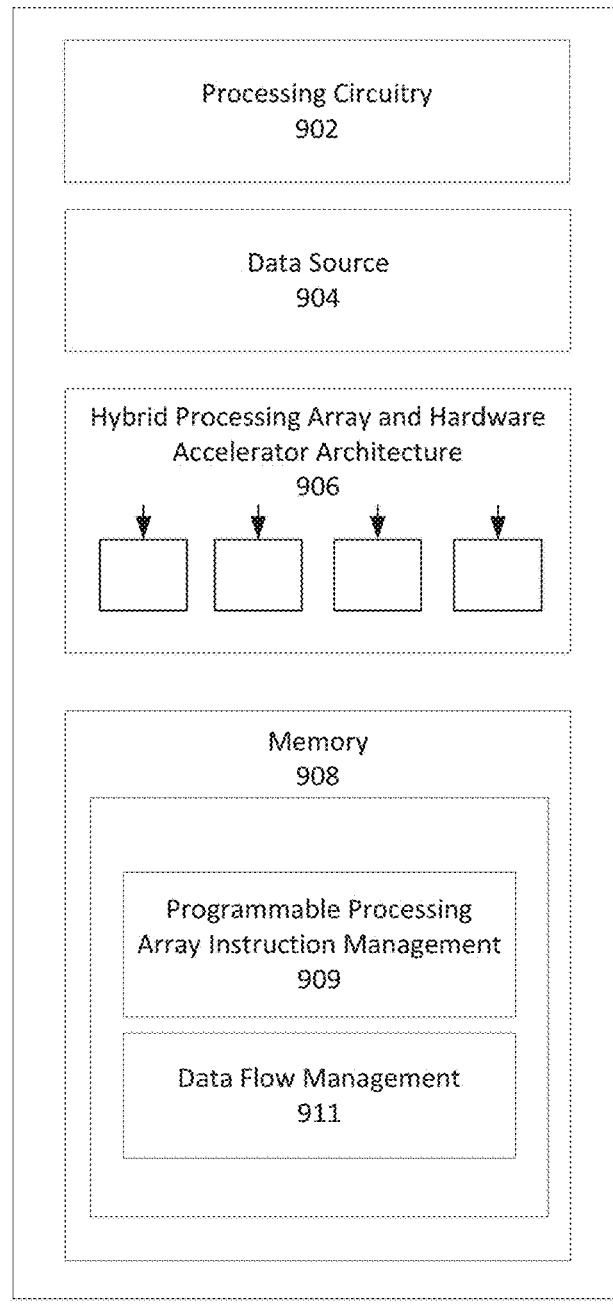
FIG. 9 illustrates an example device, in accordance with the disclosure.

FIG. 9 illustrates an example device, in accordance with the disclosure. The device 900 may be identified with one or more devices implementing a hybrid architecture, such as the hybrid architectures 600, 650 as shown and discussed herein with reference to FIGS. 6A-6C. The device 900 may be identified with a wireless device, a user equipment (UE) or other suitable device configured to perform wireless communications such as a mobile phone, a laptop computer, a wireless communications base station, a tablet, etc., and which may include one or more components configured to transmit and receive radio signals and to use processing operations as discussed herein in accordance with wirelessly transmitted and/or received data, which may include DFE functions.

As further discussed below, the device 900 may perform the DFE functions as discussed herein with respect to the hybrid architectures 600, 650 as shown and discussed with respect to FIGS. 6A-6C. To do so, the device 900 may include processing circuitry 902, a data source 904, a hybrid processing array and hardware accelerator architecture 906, and a memory 908. The components shown in FIG. 9 are provided for ease of explanation, and the device 900 may implement additional, less, or alternative components as those shown in FIG. 9.

The processing circuitry 902 may be configured as any suitable number and/or type of processing circuitry and/or computer processors, which may function to control the device 900 and/or other components of the device 900. The processing circuitry 902 may be identified with one or more processors (or suitable portions thereof) implemented by the device 900 or a host system that implements the hybrid architecture 600, 650. The processing circuitry 902 may be identified with one or more processors such as a host processor, a digital signal processor, one or more microprocessors, graphics processors, baseband processors, microcontrollers, an application-specific integrated circuit (ASIC), part (or the entirety of) a field-programmable gate array (FPGA), etc.

In any event, the processing circuitry 902 may be configured to carry out instructions to perform arithmetical, logical, and/or input/output (I/O) operations, and/or to control the operation of one or more components of device 900 to perform various functions as described herein. The processing circuitry 902 may include one or more microprocessor cores, memory registers, buffers, clocks, etc., and may generate electronic control signals associated with the components of the device 900 to control and/or modify the operation of these components. The processing circuitry 902 may communicate with and/or control functions associated with the data source 904, the hybrid architecture 906, and/or the memory 908.

The data source 904 may be implemented as any suitable type of data source to facilitate the transmission and reception of data in accordance with any suitable data rate and/or communication protocol. The data source 904 may comprise a data modem or any other suitable components configured to send and receive data such as IQ data in a digital form, which may include the digital data streams as discussed herein.

The hybrid architecture 906 may be implemented as any suitable number and/or type of components configured to transmit and/or receive data and/or wireless signals in accordance with any suitable number and/or type of communication protocols. The hybrid architecture 906 may include a digital RF front end comprising any suitable type of components to facilitate this functionality, including components associated with known transceiver, transmitter, and/or receiver operation, configurations, and implementations. The hybrid architecture 906 may include any suitable number of transmitters, receivers, or combinations of these that may be integrated into a single transceiver or as multiple transceivers or transceiver modules. The hybrid architecture 906 may include components typically identified with an RF front end and include antennas, ports, power amplifiers (PAs), RF filters, mixers, local oscillators (LOs), low noise amplifiers (LNAs), upconverters, downconverters, channel tuners, etc. Thus, the hybrid architecture 906 may be configured as any suitable number and/or type of components configured to facilitate receiving and/or transmitting data and/or signals in accordance with one or more communication protocols.

The hybrid architecture 906 may be implemented as any suitable number and/or type of components to support wireless communications, and may be identified with the components of a DFE as shown and discussed herein with reference to FIGS. 6A-6C. This may include analog-to-digital converters (ADCs), digital to analog converters (DACs), intermediate frequency (IF) amplifiers and/or filters, modulators, demodulators, baseband processors, one or more sample interfaces, one or more components otherwise known to be identified with RF front ends and/or DFEs, etc. The data received via the hybrid architecture 906 (such as received data samples), data provided to the hybrid architecture 906 for transmission (such as data samples for transmission), and/or data used in conjunction with the transmission and/or reception of data (digital filter coefficients, DPD terms, etc.) may be processed as data streams via the hybrid architecture 906, as discussed herein. Thus, the hybrid architecture 906 may be identified with the hybrid architecture 400 as shown and described herein with reference to FIG. 4, the hybrid architecture 600, 650 as discussed herein with reference to FIGS. 6A-6C, etc.

The memory 908 stores data and/or instructions such that, when the instructions are executed by the processing circuitry 902, cause the device 900 to perform various functions as described herein with respect to the hybrid architecture 906, such as controlling, monitoring, and/or regulating the flow of data through the hybrid architecture 906. The memory 908 may be implemented as any well-known volatile and/or non-volatile memory, including read-only memory (ROM), random access memory (RAM), flash memory, a magnetic storage media, an optical disc, erasable programmable read only memory (EPROM), programmable read only memory (PROM), etc. The memory 908 may be non-removable, removable, or a combination of both. The memory 908 may be implemented as a non-transitory computer readable medium storing one or more executable instructions such as, for example, logic, algorithms, code, etc.

As further discussed below, the instructions, logic, code, etc., stored in the memory 908 are represented by the various modules as shown, which may enable the functionality disclosed herein to be functionally realized. Alternatively, the modules as shown in FIG. 9 that are associated with the memory 908 may include instructions and/or code to facilitate control and/or monitor the operation of hardware components implemented via the device 900. In other words, the modules shown in FIG. 9 are provided for ease of explanation regarding the functional association between hardware and software components. Thus, the processing circuitry 902 may execute the instructions stored in these respective modules in conjunction with one or more hardware components to perform the various functions as discussed herein.

The executable instructions stored in the programmable processing array instruction management module 909 may facilitate, in conjunction with execution via the processing circuitry 902, the device 900 receiving and decoding processor instructions (which may be sent via the processing circuitry 902 or other suitable component of the device 900 or a component external to the device 900), and providing arrays of data samples to the PEs within the processing array portion of the hybrid architecture 906 (such as via the various data interfaces and buffers as discussed herein). Additionally or alternatively, the executable instructions stored in the programmable processing array instruction management module 909 may facilitate, in conjunction with execution via the processing circuitry 902, the device 900 performing the functions of the hybrid architectures 600, 650, as discussed herein. The functionality provided by the programmable processing array instruction management module 909 is a function of the particular implementation and/or type of processing array implemented via the device 900.

Thus, if a vector processor is implemented, then the programmable processing array instruction management module 909 may facilitate the determination of each specific vector processor instruction to perform specific types of vector processing operations and/or any of the functionality with respect to a vector processor architecture such as the retrieval of vector data samples from vector registers, performing vector processing operations and/or computations, providing the results of vector processing operations to the hardware accelerator portion of the hybrid processing array and hardware accelerator architecture 806, etc. Of course, in the event that the device 900 implements an FPGA, DSP, or other suitable type of processing array architecture, then the programmable processing array instruction management module 909 may function to translate and/or decode instructions to identify the type of processing operations and/or calculations to perform on arrays of data samples in an analogous manner as the use of a vector processor.

The executable instructions stored in the data flow management module 911 may facilitate, in conjunction with execution via the processing circuitry 902, the routing of the arrays or blocks of data samples within the hybrid architecture 906. This may include routing arrays of data samples to the processing array 608, to the data interfaces 610, 612, 614, 616, converting arrays of data samples to a format recognized by the hardware accelerators 602, 652, 604, 654, and vice-versa. Thus, the executable instructions stored in the data flow management module 911 may facilitate routing data samples within the hybrid architecture 600, 650, as discussed herein.

General Operation of a First SoC

A system on a chip (SoC) is provided. With reference to FIGS. 4 and 6A, the SoC includes: a first buffer configured to store a predetermined number of transmit (TX) data samples identified with a first data transmission from among a plurality of sequential data transmissions; a second buffer configured to store a predetermined number of receive (RX) data samples identified with a data reception obtained via a feedback measurement that is performed with respect to the predetermined number of TX data samples that are transmitted in accordance with the first data transmission; a processing array configured to compute digital pre-distortion (DPD) parameters using (i) the predetermined number of TX data samples, and (ii) the predetermined number of RX data samples, which are accessed from the first and second buffer, respectively, in a time-aligned manner with one another; and a hardware accelerator configured to apply, to data samples identified with a second data transmission from among the plurality of sequential data transmissions, DPD terms in accordance with the computed DPD parameters. Furthermore, the predetermined number of TX data samples and the predetermined number of RX data samples are provided to the processing array in a time-aligned manner based upon a base station frame number (BFN) counter. In addition or in alternative to and in any combination with the optional features previously explained in this paragraph, the predetermined number of TX data samples are stored in the first buffer referenced to a first base station frame number (BFN) counter time, the predetermined number of RX data samples are stored in the second buffer referenced to a second BFN counter time, and a difference between the first and the second BFN counter time is based upon a predetermined latency time value such that the predetermined number of TX data samples and the predetermined number of RX data samples are provided to the processing array in the time-aligned manner. In addition or in alternative to and in any combination with the optional features previously explained in this paragraph, the SoC further includes a counter having a predetermined counter value, and latch logic configured to increment the counter in response to each one of a number of TX data samples being sequentially transferred along a transmit path to the hardware accelerator, and to begin latching the TX data samples identified with the first data transmission when the number of TX data samples matches the predetermined counter value. In addition or in alternative to and in any combination with the optional features previously explained in this paragraph, the latch logic is configured, upon the number of TX data samples matching the predetermined counter value, to continue to latch the TX data samples until a number of TX data samples have been latched that are equal to the predetermined number of TX data samples, which are then stored in the first buffer. In addition or in alternative to and in any combination with the optional features previously explained in this paragraph, the predetermined counter value corresponds to a time that is aligned with a base station frame number (BFN) counter time. In addition or in alternative to and in any combination with the optional features previously explained in this paragraph, the SoC further includes a further hardware accelerator configured to upconvert data samples received via a digital data stream, and to generate, as the TX data samples identified with the first data transmissions, upconverted TX data samples. In addition or in alternative to and in any combination with the optional features previously explained in this paragraph, the latch logic is configured to increment the counter in response to each one of a number of the upconverted TX data samples being sequentially transferred from the further hardware accelerator along the transmit path to the hardware accelerator. In addition or in alternative to and in any combination with the optional features previously explained in this paragraph, the predetermined number of TX data samples and the predetermined number of RX data samples are provided to the processing array in a time-aligned manner over multiple clock cycles, each one of the multiple clock cycles being time-referenced to a respective base station frame number (BFN) counter time. In addition or in alternative to and in any combination with the optional features previously explained in this paragraph, the hardware accelerator configured to apply the DPD terms in accordance with the computed DPD parameters to TX data samples identified with a second data transmission during a downlink (DL) time slot scheduled in accordance with a communication protocol utilized for the plurality of sequential data transmissions.

General Operation of a Second SoC

A system on a chip (SoC) is provided. With reference to FIGS. 4 and 6B, the SoC includes: a buffer configured to store (i) a predetermined number of transmit (TX) data samples identified with a first data transmission from among a plurality of sequential data transmissions, and (ii) a predetermined number of receive (RX) data samples identified with a data reception obtained via a feedback measurement that is performed with respect to the predetermined number of TX data samples that are transmitted in accordance with the first data transmission; a processing array configured to compute digital pre-distortion (DPD) parameters using (i) the predetermined number of TX data samples, and (ii) the predetermined number of RX data samples, which are accessed from the buffer in a time-aligned manner with one another; and a hardware accelerator configured to apply, to data samples identified with a second data transmission from among the plurality of sequential data transmissions, DPD terms in accordance with the computed DPD parameters. Furthermore, the predetermined number of TX data samples and the predetermined number of RX data samples are provided to the processing array in a time-aligned manner based upon a base station frame number (BFN) counter. In addition or in alternative to and in any combination with the optional features previously explained in this paragraph, the predetermined number of TX data samples are stored in the buffer referenced to a first base station frame number (BFN) counter time, and the predetermined number of RX data samples are stored in the buffer referenced to a second BFN counter time. In addition or in alternative to and in any combination with the optional features previously explained in this paragraph, a difference between the first and the second BFN counter time is based upon a predetermined latency time value such that the predetermined number of TX data samples and the predetermined number of RX data samples are provided to the processing array in the time-aligned manner. In addition or in alternative to and in any combination with the optional features previously explained in this paragraph, the SoC further includes a further hardware accelerator configured to upconvert data samples received via a digital data stream, and to generate, as the TX data samples identified with the first data transmissions, upconverted TX data samples. In addition or in alternative to and in any combination with the optional features previously explained in this paragraph, the predetermined number of TX data samples and the predetermined number of RX data samples are provided to the processing array in a time-aligned manner over multiple clock cycles, each one of the multiple clock cycles being time-referenced to a respective base station frame number (BFN) counter time. In addition or in alternative to and in any combination with the optional features previously explained in this paragraph, the hardware accelerator configured to apply the DPD terms in accordance with the computed DPD parameters to TX data samples identified with a second data transmission during a downlink (DL) time slot scheduled in accordance with a communication protocol utilized for the plurality of sequential data transmissions. In addition or in alternative to and in any combination with the optional features previously explained in this paragraph, the predetermined number of TX data samples stored in the buffer comprise data samples generated via the processing array as a result of processing operations that are performed on a further predetermined number of TX data samples identified with the first data transmission. In addition or in alternative to and in any combination with the optional features previously explained in this paragraph, the predetermined number of TX data samples stored in the buffer comprise data samples generated via the hardware accelerator by applying further computed DPD parameters associated with a previous data transmission on a further predetermined number of TX data samples identified with the first data transmission. In addition or in alternative to and in any combination with the optional features previously explained in this paragraph, the SoC further includes a multiplexer configured to selectively route the predetermined number of TX data samples to be stored in the buffer as one of (i) data samples generated via the processing array as a result of processing operations that are performed on a further predetermined number of TX data samples identified with the first data transmission, or (ii) data samples generated via the hardware accelerator by applying further computed DPD parameters associated with a previous data transmission on further predetermined number of TX data samples identified with the first data transmission.

A Process Flow

Figure 10:
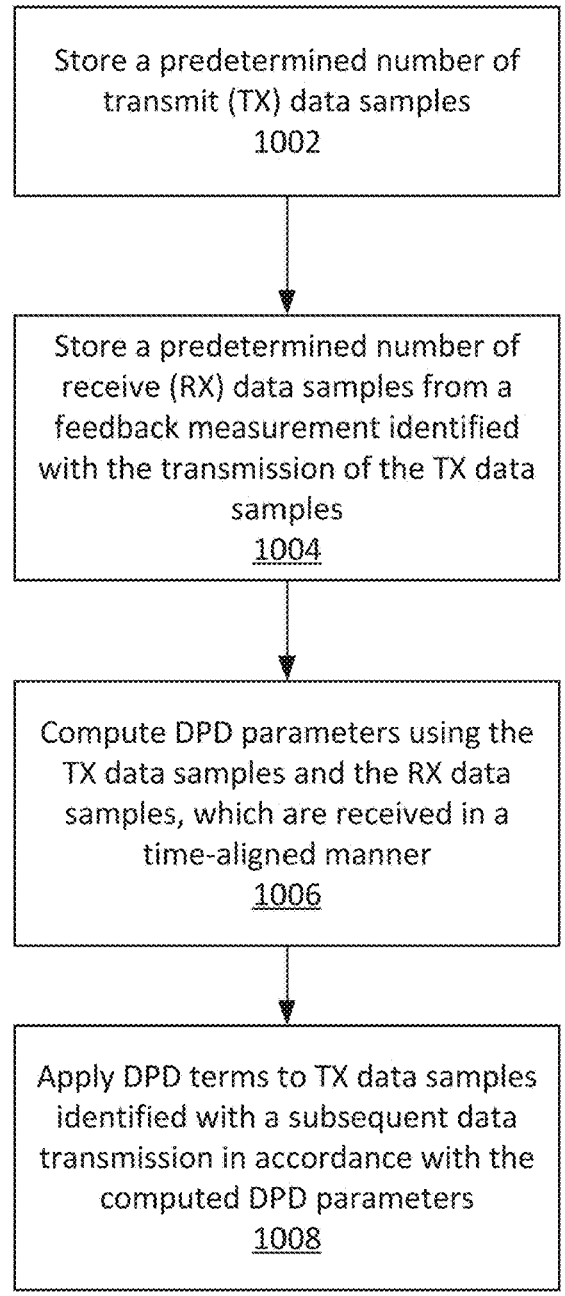
FIG. 10 illustrates a process flow, in accordance with the disclosure.

FIG. 10 illustrates a process flow. With reference to FIG. 10, the process flow 1000 may be a computer-implemented method executed by and/or otherwise associated with one or more processors (processing circuitry) and/or storage devices. These processors and/or storage devices may be associated with one or more components of the hybrid architectures 600, 650 as discussed herein and/or one or more components of the device 900 as discussed herein. The processors and/or storage devices may be identified with one or more components of the hybrid architectures 600, 650, such as the hardware accelerators 602, 604, 652, 654, processing circuitry identified with the hardware accelerators 602, 604, 652, 654, the PEs of the processing array 608, and/or the processing circuitry 902. The flow 1000 may include alternate or additional steps that are not shown in FIG. 10 for purposes of brevity, and may be performed in a different order than the steps shown in FIG. 10.

Flow 1000 may begin when one or more processors store (block 1002) a predetermined number of TX data samples for transmission. These TX data samples may be up-sampled, filtered, band combined, etc., as discussed above with reference to FIGS. 6A-6C. The TX data samples may be stored in any suitable buffer, such as the buffers 680, 684B from any suitable stage within the transmit path of the hybrid architecture 600, 650, as discussed above.

Flow 1000 may include one or more processors storing (block 1004) a predetermined number of RX data samples from a feedback measurement identified with the transmission of the TX data samples. These RX data samples may correspond to observed RX data samples measured from a PA output, as discussed above with reference to FIGS. 6A-6C.

Flow 1000 may include one or more processors computing (block 1006) updated DPD parameters using the stored TX and RX data samples, which are received or otherwise provided in a time-aligned manner. This may include providing the processing array 608 with the TX and observed RX samples stored in the buffers 680, 684A, 684B, as the case may be, in a BFN time controlled manner such that the TX and RX data samples are time-aligned data samples, as noted above.

Flow 1000 may include one or more processors applying (block 1008) DPD terms to the TX data samples for a subsequent data transmission. This may include the hardware block 620 accessing the computed DPD parameters and then applying, in accordance with the computed DPD parameters, the DPD terms to subsequent data samples to perform DPD adaptation, as noted above.

EXAMPLES

The following examples pertain to various techniques of the present disclosure.

An example (e.g. example 1) relates to a system on a chip (SoC), comprising: a first buffer configured to store a predetermined number of transmit (TX) data samples identified with a first data transmission from among a plurality of sequential data transmissions; a second buffer configured to store a predetermined number of receive (RX) data samples identified with a data reception obtained via a feedback measurement that is performed with respect to the predetermined number of TX data samples that are transmitted in accordance with the first data transmission; a processing array configured to compute digital pre-distortion (DPD) parameters using (i) the predetermined number of TX data samples, and (ii) the predetermined number of RX data samples, which are accessed from the first and second buffer, respectively, in a time-aligned manner with one another; and a hardware accelerator configured to apply, to data samples identified with a second data transmission from among the plurality of sequential data transmissions, DPD terms in accordance with the computed DPD parameters.

Another example (e.g. example 2) relates to a previously-described example (e.g. example 1), wherein the predetermined number of TX data samples and the predetermined number of RX data samples are provided to the processing array in a time-aligned manner based upon a base station frame number (BFN) counter.

Another example (e.g. example 3) relates to a previously-described example (e.g. one or more of examples 1-2), wherein: the predetermined number of TX data samples are stored in the first buffer referenced to a first base station frame number (BFN) counter time, the predetermined number of RX data samples are stored in the second buffer referenced to a second BFN counter time, and wherein a difference between the first and the second BFN counter time is based upon a predetermined latency time value such that the predetermined number of TX data samples and the predetermined number of RX data samples are provided to the processing array in the time-aligned manner.

Another example (e.g. example 4) relates to a previously-described example (e.g. one or more of examples 1-3), further comprising: a counter having a predetermined counter value, and latch logic configured to increment the counter in response to each one of a number of TX data samples being sequentially transferred along a transmit path to the hardware accelerator, and to begin latching the TX data samples identified with the first data transmission when the number of TX data samples matches the predetermined counter value.

Another example (e.g. example 5) relates to a previously-described example (e.g. one or more of examples 1-4), wherein the latch logic is configured, upon the number of TX data samples matching the predetermined counter value, to continue to latch the TX data samples until a number of TX data samples have been latched that are equal to the predetermined number of TX data samples, which are then stored in the first buffer.

Another example (e.g. example 6) relates to a previously-described example (e.g. one or more of examples 1-5), wherein the predetermined counter value corresponds to a time that is aligned with a base station frame number (BFN) counter time.

Another example (e.g. example 7) relates to a previously-described example (e.g. one or more of examples 1-6), further comprising: a further hardware accelerator configured to upconvert data samples received via a digital data stream, and to generate, as the TX data samples identified with the first data transmissions, upconverted TX data samples.

Another example (e.g. example 8) relates to a previously-described example (e.g. one or more of examples 1-7), wherein the latch logic is configured to increment the counter in response to each one of a number of the upconverted TX data samples being sequentially transferred from the further hardware accelerator along the transmit path to the hardware accelerator.

Another example (e.g. example 9) relates to a previously-described example (e.g. one or more of examples 1-8), wherein the predetermined number of TX data samples and the predetermined number of RX data samples are provided to the processing array in a time-aligned manner over multiple clock cycles, each one of the multiple clock cycles being time-referenced to a respective base station frame number (BFN) counter time.

Another example (e.g. example 10) relates to a previously-described example (e.g. one or more of examples 1-9), wherein the hardware accelerator configured to apply the DPD terms in accordance with the computed DPD parameters to TX data samples identified with a second data transmission during a downlink (DL) time slot scheduled in accordance with a communication protocol utilized for the plurality of sequential data transmissions.

An example (e.g. example 11) relates to a system on a chip (SoC), comprising: a buffer configured to store (i) a predetermined number of transmit (TX) data samples identified with a first data transmission from among a plurality of sequential data transmissions, and (ii) a predetermined number of receive (RX) data samples identified with a data reception obtained via a feedback measurement that is performed with respect to the predetermined number of TX data samples that are transmitted in accordance with the first data transmission; a processing array configured to compute digital pre-distortion (DPD) parameters using (i) the predetermined number of TX data samples, and (ii) the predetermined number of RX data samples, which are accessed from the buffer in a time-aligned manner with one another; and a hardware accelerator configured to apply, to data samples identified with a second data transmission from among the plurality of sequential data transmissions, DPD terms in accordance with the computed DPD parameters.

Another example (e.g. example 12) relates to a previously-described example (e.g. example 11), wherein the predetermined number of TX data samples and the predetermined number of RX data samples are provided to the processing array in a time-aligned manner based upon a base station frame number (BFN) counter.

Another example (e.g. example 13) relates to a previously-described example (e.g. one or more of examples 11-12), wherein the predetermined number of TX data samples are stored in the buffer referenced to a first base station frame number (BFN) counter time, and wherein the predetermined number of RX data samples are stored in the buffer referenced to a second BFN counter time.

Another example (e.g. example 14) relates to a previously-described example (e.g. one or more of examples 11-13), wherein a difference between the first and the second BFN counter time is based upon a predetermined latency time value such that the predetermined number of TX data samples and the predetermined number of RX data samples are provided to the processing array in the time-aligned manner.

Another example (e.g. example 15) relates to a previously-described example (e.g. one or more of examples 11-14), further comprising: a further hardware accelerator configured to upconvert data samples received via a digital data stream, and to generate, as the TX data samples identified with the first data transmissions, upconverted TX data samples.

Another example (e.g. example 16) relates to a previously-described example (e.g. one or more of examples 11-15), wherein the predetermined number of TX data samples and the predetermined number of RX data samples are provided to the processing array in a time-aligned manner over multiple clock cycles, each one of the multiple clock cycles being time-referenced to a respective base station frame number (BFN) counter time.

Another example (e.g. example 17) relates to a previously-described example (e.g. one or more of examples 11-16), wherein the hardware accelerator configured to apply the DPD terms in accordance with the computed DPD parameters to TX data samples identified with a second data transmission during a downlink (DL) time slot scheduled in accordance with a communication protocol utilized for the plurality of sequential data transmissions.

Another example (e.g. example 18) relates to a previously-described example (e.g. one or more of examples 11-17), wherein the predetermined number of TX data samples stored in the buffer comprise data samples generated via the processing array as a result of processing operations that are performed on a further predetermined number of TX data samples identified with the first data transmission.

Another example (e.g. example 19) relates to a previously-described example (e.g. one or more of examples 11-18), wherein the predetermined number of TX data samples stored in the buffer comprise data samples generated via the hardware accelerator by applying further computed DPD parameters associated with a previous data transmission on a further predetermined number of TX data samples identified with the first data transmission.

Another example (e.g. example 20) relates to a previously-described example (e.g. one or more of examples 11-19), further comprising: a multiplexer configured to selectively route the predetermined number of TX data samples to be stored in the buffer as one of (i) data samples generated via the processing array as a result of processing operations that are performed on a further predetermined number of TX data samples identified with the first data transmission, or (ii) data samples generated via the hardware accelerator by applying further computed DPD parameters associated with a previous data transmission on further predetermined number of TX data samples identified with the first data transmission.

An example (e.g. example 21) relates to a system on a chip (SoC), comprising: a first buffer configured to store a predetermined number of transmit (TX) data samples identified with a first data transmission from among a plurality of sequential data transmissions; a second buffer configured to store a predetermined number of receive (RX) data samples identified with a data reception obtained via a feedback measurement that is performed with respect to the predetermined number of TX data samples that are transmitted in accordance with the first data transmission; a processing means configured to compute digital pre-distortion (DPD) parameters using (i) the predetermined number of TX data samples, and (ii) the predetermined number of RX data samples, which are accessed from the first and second buffer, respectively, in a time-aligned manner with one another; and a hardware accelerator means for applying, to data samples identified with a second data transmission from among the plurality of sequential data transmissions, DPD terms in accordance with the computed DPD parameters.

Another example (e.g. example 22) relates to a previously-described example (e.g. example 21), wherein the predetermined number of TX data samples and the predetermined number of RX data samples are provided to the processing array in a time-aligned manner based upon a base station frame number (BFN) counter.

Another example (e.g. example 23) relates to a previously-described example (e.g. one or more of examples 21-22), wherein: the predetermined number of TX data samples are stored in the first buffer referenced to a first base station frame number (BFN) counter time, the predetermined number of RX data samples are stored in the second buffer referenced to a second BFN counter time, and wherein a difference between the first and the second BFN counter time is based upon a predetermined latency time value such that the predetermined number of TX data samples and the predetermined number of RX data samples are provided to the processing means in the time-aligned manner.

Another example (e.g. example 24) relates to a previously-described example (e.g. one or more of examples 21-23), further comprising: a counter means having a predetermined counter value, and latching means for incrementing the counter in response to each one of a number of TX data samples being sequentially transferred along a transmit path to the hardware accelerator, and to begin latching the TX data samples identified with the first data transmission when the number of TX data samples matches the predetermined counter value.

Another example (e.g. example 25) relates to a previously-described example (e.g. one or more of examples 21-24), wherein the latching means is configured, upon the number of TX data samples matching the predetermined counter value, to continue to latch the TX data samples until a number of TX data samples have been latched that are equal to the predetermined number of TX data samples, which are then stored in the first buffer.

Another example (e.g. example 26) relates to a previously-described example (e.g. one or more of examples 21-25), wherein the predetermined counter value corresponds to a time that is aligned with a base station frame number (BFN) counter time.

Another example (e.g. example 27) relates to a previously-described example (e.g. one or more of examples 21-26), further comprising: a further hardware accelerator means for upconverting data samples received via a digital data stream, and for generating, as the TX data samples identified with the first data transmissions, upconverted TX data samples.

Another example (e.g. example 28) relates to a previously-described example (e.g. one or more of examples 21-27), wherein the latching means increments the counter means in response to each one of a number of the upconverted TX data samples being sequentially transferred from the further hardware accelerator means along the transmit path to the hardware accelerator means.

Another example (e.g. example 29) relates to a previously-described example (e.g. one or more of examples 21-28), wherein the predetermined number of TX data samples and the predetermined number of RX data samples are provided to the processing means in a time-aligned manner over multiple clock cycles, each one of the multiple clock cycles being time-referenced to a respective base station frame number (BFN) counter time.

Another example (e.g. example 30) relates to a previously-described example (e.g. one or more of examples 21-29), wherein the hardware accelerator means applies the DPD terms in accordance with the computed DPD parameters to TX data samples identified with a second data transmission during a downlink (DL) time slot scheduled in accordance with a communication protocol utilized for the plurality of sequential data transmissions.

An example (e.g. example 31) relates to a system on a chip (SoC), comprising: a buffer configured to store (i) a predetermined number of transmit (TX) data samples identified with a first data transmission from among a plurality of sequential data transmissions, and (ii) a predetermined number of receive (RX) data samples identified with a data reception obtained via a feedback measurement that is performed with respect to the predetermined number of TX data samples that are transmitted in accordance with the first data transmission; a processing means for computing digital pre-distortion (DPD) parameters using (i) the predetermined number of TX data samples, and (ii) the predetermined number of RX data samples, which are accessed from the buffer in a time-aligned manner with one another; and a hardware accelerator means for applying, to data samples identified with a second data transmission from among the plurality of sequential data transmissions, DPD terms in accordance with the computed DPD parameters.

Another example (e.g. example 32) relates to a previously-described example (e.g. example 31), wherein the predetermined number of TX data samples and the predetermined number of RX data samples are provided to the processing means in a time-aligned manner based upon a base station frame number (BFN) counter.

Another example (e.g. example 33) relates to a previously-described example (e.g. one or more of examples 31-32), wherein the predetermined number of TX data samples are stored in the buffer referenced to a first base station frame number (BFN) counter time, and wherein the predetermined number of RX data samples are stored in the buffer referenced to a second BFN counter time.

Another example (e.g. example 34) relates to a previously-described example (e.g. one or more of examples 31-33), wherein a difference between the first and the second BFN counter time is based upon a predetermined latency time value such that the predetermined number of TX data samples and the predetermined number of RX data samples are provided to the processing means in the time-aligned manner.

Another example (e.g. example 35) relates to a previously-described example (e.g. one or more of examples 31-34), further comprising: a further hardware accelerator configured to upconvert data samples received via a digital data stream, and to generate, as the TX data samples identified with the first data transmissions, upconverted TX data samples.

Another example (e.g. example 36) relates to a previously-described example (e.g. one or more of examples 31-35), wherein the predetermined number of TX data samples and the predetermined number of RX data samples are provided to the processing means in a time-aligned manner over multiple clock cycles, each one of the multiple clock cycles being time-referenced to a respective base station frame number (BFN) counter time.

Another example (e.g. example 37) relates to a previously-described example (e.g. one or more of examples 31-36), wherein the hardware accelerator means applies the DPD terms in accordance with the computed DPD parameters to TX data samples identified with a second data transmission during a downlink (DL) time slot scheduled in accordance with a communication protocol utilized for the plurality of sequential data transmissions.

Another example (e.g. example 38) relates to a previously-described example (e.g. one or more of examples 31-37), wherein the predetermined number of TX data samples stored in the buffer comprise data samples generated via the processing means as a result of processing operations that are performed on a further predetermined number of TX data samples identified with the first data transmission.

Another example (e.g. example 39) relates to a previously-described example (e.g. one or more of examples 31-38), wherein the predetermined number of TX data samples stored in the buffer comprise data samples generated via the hardware accelerator means by applying further computed DPD parameters associated with a previous data transmission on a further predetermined number of TX data samples identified with the first data transmission.

Another example (e.g. example 40) relates to a previously-described example (e.g. one or more of examples 31-39), further comprising: a multiplexer means for selectively routing the predetermined number of TX data samples to be stored in the buffer as one of (i) data samples generated via the processing array as a result of processing operations that are performed on a further predetermined number of TX data samples identified with the first data transmission, or (ii) data samples generated via the hardware accelerator means by applying further computed DPD parameters associated with a previous data transmission on further predetermined number of TX data samples identified with the first data transmission.

An apparatus as shown and described.

A method as shown and described.

CONCLUSION

The aforementioned description will so fully reveal the general nature of the disclosure that others can, by applying knowledge within the skill of the art, readily modify and/or adapt for various applications without undue experimentation, and without departing from the general concept of the present disclosure. Therefore, such adaptations and modifications are intended to be within the meaning and range of equivalents of the disclosed implementations, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one implementation," "an implementation," "an exemplary implementation," etc., indicate that the implementation described may include a particular feature, structure, or characteristic, but every implementation may not necessarily include the particular feature, structure, or characteristic. Moreover, such phrases are not necessarily referring to the same implementation. Further, when a particular feature, structure, or characteristic is described in connection with an implementation, it is submitted that it is within the knowledge of one skilled in the art to affect such feature, structure, or characteristic in connection with other implementations whether or not explicitly described.

The implementation described herein are provided for illustrative purposes, and are not limiting. Other implementation are possible, and modifications may be made to the described implementations. Therefore, the specification is not meant to limit the disclosure. Rather, the scope of the disclosure is defined only in accordance with the following claims and their equivalents.

The implementations described herein may be facilitated in hardware (e.g., circuits), firmware, software, or any combination thereof. Implementations may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processing circuitry" or "processor circuitry" shall be understood to be circuit(s), processor(s), logic, or a combination thereof. For example, a circuit can include an analog circuit, a digital circuit, state machine logic, other structural electronic hardware, or a combination thereof. A processor can include a microprocessor, a digital signal processor (DSP), or other hardware processor. The processor can be "hard-coded" with instructions to perform corresponding function(s) according to implementations described herein. Alternatively, the processor can access an internal and/or external memory to retrieve instructions stored in the memory, which when executed by the processor, perform the corresponding function(s) associated with the processor, and/or one or more functions and/or operations related to the operation of a component having the processor included therein.

In one or more of the implementations described herein, processing circuitry can include memory that stores data and/or instructions. The memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

What is claimed is:

1. A system on a chip (SoC), comprising:
 a first buffer configured to store a predetermined number of transmit (TX) data samples identified with a first data transmission from among a plurality of sequential data transmissions;
 a second buffer configured to store a predetermined number of receive (RX) data samples identified with a data reception obtained via a feedback measurement that is performed with respect to the predetermined number of TX data samples that are transmitted in accordance with the first data transmission;
 a processing array configured to compute digital pre-distortion (DPD) parameters using (i) the predetermined number of TX data samples, and (ii) the predetermined number of RX data samples, which are accessed from the first and second buffer, respectively, in a time-aligned manner with one another; and a hardware accelerator configured to apply, to data samples identified with a second data transmission from among the plurality of sequential data transmissions, DPD terms in accordance with the computed DPD parameters.

2. The SoC of claim 1, wherein the predetermined number of TX data samples and the predetermined number of RX data samples are provided to the processing array in a time-aligned manner based upon a base station frame number (BFN) counter.

3. The SoC of claim 1, wherein:
the predetermined number of TX data samples are stored in the first buffer referenced to a first base station frame number (BFN) counter time,
the predetermined number of RX data samples are stored in the second buffer referenced to a second BFN counter time, and
wherein a difference between the first and the second BFN counter time is based upon a predetermined latency time value such that the predetermined number of TX data samples and the predetermined number of RX data samples are provided to the processing array in the time-aligned manner.

4. The SoC of claim 1, further comprising:
a counter having a predetermined counter value, and
latch logic configured to increment the counter in response to each one of a number of TX data samples being sequentially transferred along a transmit path to the hardware accelerator, and to begin latching the TX data samples identified with the first data transmission when the number of TX data samples matches the predetermined counter value.

5. The SoC of claim 4, wherein the latch logic is configured, upon the number of TX data samples matching the predetermined counter value, to continue to latch the TX data samples until a number of TX data samples have been latched that are equal to the predetermined number of TX data samples, which are then stored in the first buffer.

6. The SoC of claim 4, wherein the predetermined counter value corresponds to a time that is aligned with a base station frame number (BFN) counter time.

7. The SoC of claim 4, further comprising:
a further hardware accelerator configured to upconvert data samples received via a digital data stream, and to generate, as the TX data samples identified with the first data transmission, upconverted TX data samples.

8. The SoC of claim 7, wherein the latch logic is configured to increment the counter in response to each one of a number of the upconverted TX data samples being sequentially transferred from the further hardware accelerator along the transmit path to the hardware accelerator.

9. The SoC of claim 1, wherein the predetermined number of TX data samples and the predetermined number of RX data samples are provided to the processing array in a time-aligned manner over multiple clock cycles, each one of the multiple clock cycles being time-referenced to a respective base station frame number (BFN) counter time.

10. The SoC of claim 1, wherein the hardware accelerator is configured to apply the DPD terms in accordance with the computed DPD parameters to TX data samples identified with the second data transmission during a downlink (DL) time slot scheduled in accordance with a communication protocol utilized for the plurality of sequential data transmissions.

11. A system on a chip (SoC), comprising:
a buffer configured to store (i) a predetermined number of transmit (TX) data samples identified with a first data transmission from among a plurality of sequential data transmissions, and (ii) a predetermined number of receive (RX) data samples identified with a data reception obtained via a feedback measurement that is performed with respect to the predetermined number of TX data samples that are transmitted in accordance with the first data transmission;
a processing array configured to compute digital predistortion (DPD) parameters using (i) the predetermined number of TX data samples, and (ii) the predetermined number of RX data samples, which are accessed from the buffer in a time-aligned manner with one another; and
a hardware accelerator configured to apply, to data samples identified with a second data transmission from among the plurality of sequential data transmissions, DPD terms in accordance with the computed DPD parameters.

12. The SoC of claim 11, wherein the predetermined number of TX data samples and the predetermined number of RX data samples are provided to the processing array in a time-aligned manner based upon a base station frame number (BFN) counter.

13. The SoC of claim 11, wherein the predetermined number of TX data samples are stored in the buffer referenced to a first base station frame number (BFN) counter time, and
wherein the predetermined number of RX data samples are stored in the buffer referenced to a second BFN counter time.

14. The SoC of claim 13, wherein a difference between the first and the second BFN counter time is based upon a predetermined latency time value such that the predetermined number of TX data samples and the predetermined number of RX data samples are provided to the processing array in the time-aligned manner.

15. The SoC of claim 11, further comprising:
a further hardware accelerator configured to upconvert data samples received via a digital data stream, and to generate, as the TX data samples identified with the first data transmissions, upconverted TX data samples.

16. The SoC of claim 11, wherein the predetermined number of TX data samples and the predetermined number of RX data samples are provided to the processing array in a time-aligned manner over multiple clock cycles, each one of the multiple clock cycles being time-referenced to a respective base station frame number (BFN) counter time.

17. The SoC of claim 11, wherein the hardware accelerator is configured to apply the DPD terms in accordance with the computed DPD parameters to TX data samples identified with a second data transmission during a downlink (DL) time slot scheduled in accordance with a communication protocol utilized for the plurality of sequential data transmissions.

18. The SoC of claim 11, wherein the predetermined number of TX data samples stored in the buffer comprise data samples generated via the processing array as a result of processing operations that are performed on a further predetermined number of TX data samples identified with the first data transmission.

19. The SoC of claim 11, wherein the predetermined number of TX data samples stored in the buffer comprise data samples generated via the hardware accelerator by applying further computed DPD parameters associated with a previous data transmission on a further predetermined number of TX data samples identified with the first data transmission.

20. The SoC of claim 11, further comprising:
a multiplexer configured to selectively route the predetermined number of TX data samples to be stored in the buffer as one of (i) data samples generated via the processing array as a result of processing operations that are performed on a further predetermined number of TX data samples identified with the first data transmission, or (ii) data samples generated via the hardware accelerator by applying further computed DPD parameters associated with a previous data transmission on further predetermined number of TX data samples identified with the first data transmission.

* * * * *